(12) United States Patent
Lee

(10) Patent No.: US 12,494,463 B2
(45) Date of Patent: Dec. 9, 2025

(54) CHEMICAL SENSOR AND METHOD OF FORMING THE SAME

(71) Applicant: Agency for Science, Technology and Research, Singapore (SG)

(72) Inventor: Lennon Yao Ting Lee, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 490 days.

(21) Appl. No.: 17/928,445

(22) PCT Filed: Jun. 1, 2020

(86) PCT No.: PCT/SG2020/050318
§ 371 (c)(1),
(2) Date: Nov. 29, 2022

(87) PCT Pub. No.: WO2021/246953
PCT Pub. Date: Dec. 9, 2021

(65) Prior Publication Data
US 2023/0317698 A1     Oct. 5, 2023

(51) Int. Cl.
*H01L 25/16* (2023.01)
*G01N 21/61* (2006.01)
*H01L 23/00* (2006.01)

(52) U.S. Cl.
CPC .......... *H01L 25/167* (2013.01); *G01N 21/61* (2013.01); *H01L 24/29* (2013.01); *H01L 24/32* (2013.01);
(Continued)

(58) Field of Classification Search
CPC .... G01N 21/61; G01N 21/05; G01N 21/3504; G01N 21/3577; G01N 21/3151;
(Continued)

(56) References Cited

U.S. PATENT DOCUMENTS 5,861,545 A    1/1999 Wood
5,886,348 A    3/1999 Lessure et al.
(Continued)

FOREIGN PATENT DOCUMENTS

CN    105181621 A    12/2015
JP    2018136154 A    8/2018
(Continued)

OTHER PUBLICATIONS

Harrick et al., "Effective Thickness of Bulk Materials and of Thin Films for Internal Reflection Spectroscopy," Applied Optics, vol. 5, No. 11, Nov. 1966, pp. 1739-1743.
(Continued)

*Primary Examiner* — Mouloucoulaye Inoussa
(74) *Attorney, Agent, or Firm* — Shackelford, McKinley & Norton, LLP

(57) ABSTRACT

A chemical sensor that includes a first semiconductor substrate. The chemical sensor may also include a second semiconductor substrate. The chemical sensor may further include one or more metal layers between the first semiconductor substrate and the second semiconductor substrate such that the first and second semiconductor substrates and the one or more metal layers form a cell including a cavity, the cavity having a depth of any value equal to or less than 100 μm. The chemical sensor may also include an optical source. The chemical sensor may additionally include an optical detector such that light emitted by the optical source passes through the cell to the optical detector. The first and second semiconductor substrates and the one or more metal layers may also define at least one inlet for fluid to flow into the cavity and at least one outlet for fluid to flow out of the cavity.

17 Claims, 25 Drawing Sheets

(52) U.S. Cl.
CPC ............... *H01L 2224/29144* (2013.01); *H01L 2224/32145* (2013.01)

(58) Field of Classification Search
CPC ............ G01N 33/0022; G01N 33/004; G01N 21/0303; G01N 33/497; G01N 33/2841; G01N 21/031; G01N 2021/058; G01N 2201/0686; G01N 2201/0636; G01N 2021/3174; G01N 2201/0668; G01N 2021/3133; G01N 2021/3181; G01N 2201/062; G01N 2201/0221; G01N 2201/0662; G01N 2201/06113; H01L 24/32; H01L 25/167; H01L 24/29; H01L 2224/29144; H01L 2224/32145; G01J 3/0208; G01J 3/42; G08B 17/107; Y02A 50/20; E21B 43/34; E21B 21/01; E21B 49/0875; E21B 49/086; C12Q 1/6874; C12Q 1/6869; B01L 3/502715; B01L 3/5085; B01L 7/52; B01L 2200/10; B01L 2400/0457; B01L 2300/161; B01L 2300/0645; B01L 2300/0636; B01L 2300/0877; B01L 2300/0627; B01L 2200/025; B01L 2300/048; B01L 2300/0654; B01L 2200/16; B01L 2400/0487; B01L 2400/0622; B01L 2200/082; B01L 2300/022; B01L 2300/165; B01L 2300/0819; B01L 2200/04; B01L 2300/023
See application file for complete search history.

(56) References Cited

U.S. PATENT DOCUMENTS

| | | | |
|---|---|---|---|
| 6,320,192 B1 * | 11/2001 | Tominaga | ............... G01N 21/61 250/343 |
| 6,469,303 B1 | 10/2002 | Sun et al. | |
| 8,896,834 B2 | 11/2014 | Lin et al. | |
| 2003/0209669 A1 * | 11/2003 | Chou | .................. G01N 21/3504 250/343 |
| 2005/0230624 A1 * | 10/2005 | Schubert | ............... G01N 21/09 250/339.13 |
| 2007/0272866 A1 * | 11/2007 | Mengel | .............. G01N 21/3504 250/338.2 |
| 2010/0085569 A1 * | 4/2010 | Liu | ........................ G01N 15/06 356/338 |
| 2011/0134420 A1 * | 6/2011 | Matsumoto | ....... B01L 3/502715 356/246 |
| 2012/0182548 A1 | 7/2012 | Harb et al. | |
| 2013/0258345 A1 * | 10/2013 | Lin | .......................... G01J 5/05 356/437 |
| 2016/0116409 A1 | 4/2016 | Massetti et al. | |
| 2019/0195778 A1 * | 6/2019 | Lee | ...................... G01N 21/031 |
| 2020/0103334 A1 * | 4/2020 | Santangelo | ........ G02B 19/0023 |
| 2020/0284721 A1 * | 9/2020 | Tortschanoff | ...... G01N 21/3504 |
| 2020/0340918 A1 * | 10/2020 | Shimizu | ............... G01N 21/314 |
| 2020/0386677 A1 * | 12/2020 | Deliwala | ............... G01J 3/0208 |
| 2021/0247296 A1 * | 8/2021 | Igarashi | ................... B01J 19/12 |

FOREIGN PATENT DOCUMENTS

| | | |
|---|---|---|
| KR | 20060127438 A | 12/2006 |
| WO | 0125137 A1 | 4/2001 |
| WO | 2012167805 A1 | 12/2012 |

OTHER PUBLICATIONS

International Search Report for International Application No. PCT/SG2020/050318 dated Aug. 17, 2020, pp. 1-4.
Written Opinion of the International Searching Authority for International Application No. PCT/SG2020/050318 dated Aug. 17, 2020, pp. 1-6.

\* cited by examiner

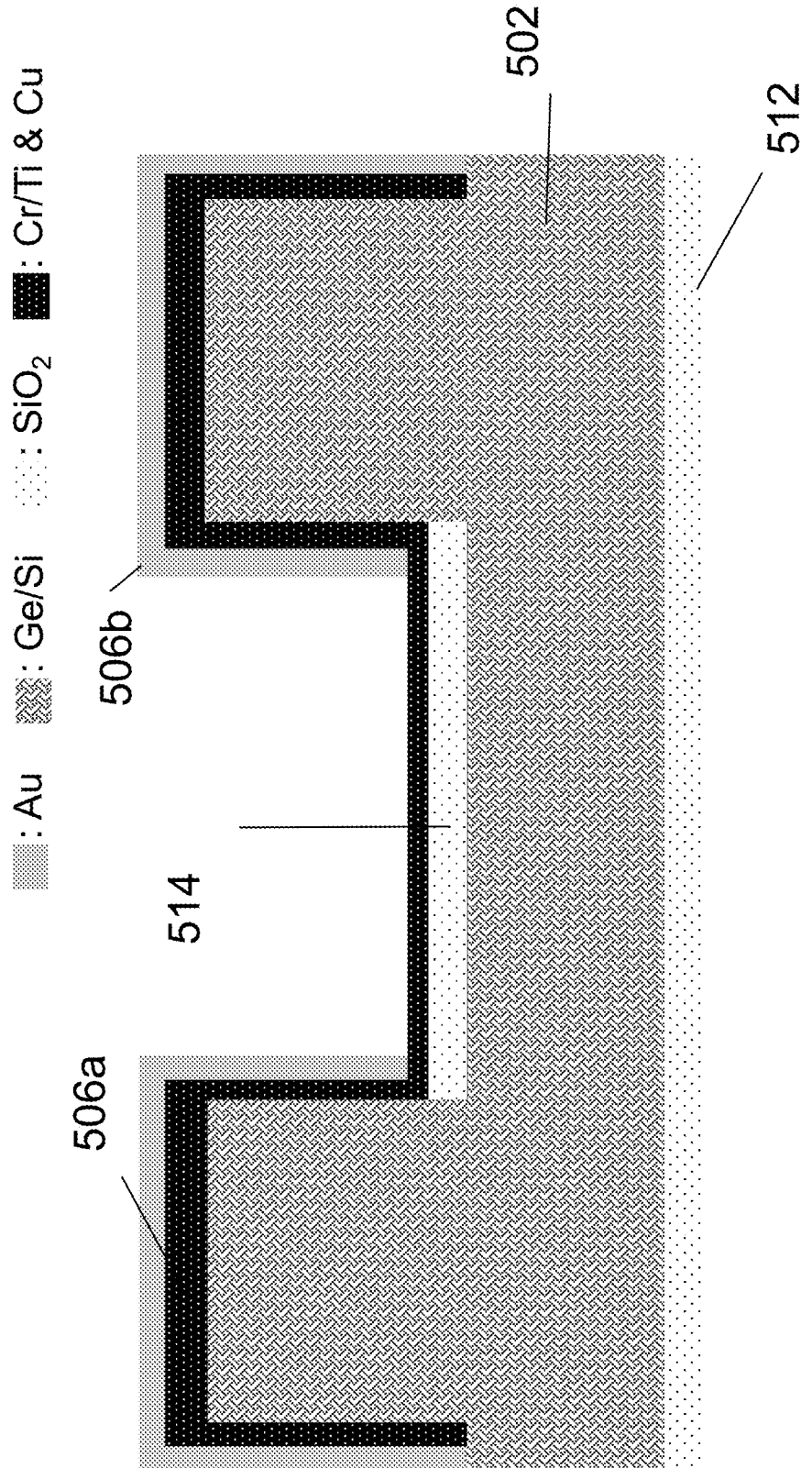

CHEMICAL SENSOR AND METHOD OF FORMING THE SAME

TECHNICAL FIELD

Various aspects of this disclosure relate to a chemical sensor. Various aspects of this disclosure relate to a method of forming a chemical sensor.

BACKGROUND

Attenuated total reflection (ATR) is typically used to measure high concentrations for liquids by optical means. The reason is that at high concentrations, most of the ultraviolet (UV)/visible/infrared (IR) light would be absorbed by the analyte and the remaining light would not be able to provide information on the identity or quantity of the analyte. Even with ATR, establishing the quantity of the analyte could be challenging as the path length, $l_s$ or $l_p$ could vary depending on the overall refractive index, $n_2$, of the medium. The path length $l_s$ or $l_p$ may be provided by:

$$l_s = \frac{\frac{n_2}{n_1}\lambda\cos\theta}{\pi\left(1-\left(\frac{n_2}{n_1}\right)^2\right)\sqrt{\sin^2\theta-\left(\frac{n_2}{n_1}\right)^2}} \quad (1)$$

$$l_p = \frac{\frac{n_2}{n_1}\lambda\cos\theta\left(2\sin^2\theta-\left(\frac{n_2}{n_1}\right)^2\right)}{\pi\left(1-\left(\frac{n_2}{n_1}\right)^2\right)\left[\left(1+\left(\frac{n_2}{n_1}\right)^2\right)\sin^2\theta-\left(\frac{n_2}{n_1}\right)^2\right]\sqrt{\sin^2\theta-\left(\frac{n_2}{n_1}\right)^2}} \quad (2)$$

where s and p represent perpendicular and parallel polarization respectively, $n_1$ represents refractive index of the total internal reflection crystal, and $\theta$ represents the incident angle.

Since the refractive index of the medium would change also depending on the different ratio and concentration of chemicals, the effective path length is not easily calculated.

In order to measure the concentrations of gases, a gas cell is normally used. Gas cells available in the market have an optical pathlength of at least 1 cm. Using Beer-Lambert law as seen below, transmittance (t) may be provided by:

$$t = e^{-\sigma nl} \quad (3)$$

where $\sigma$ is the absorption cross-section of the target gas species, n is the concentration of the attenuating species and l is the path length of the beam of light through the gas cell. At room temperature and pressure, the concentration by volume of x % may be provided by $n = x \ \%*2.5*10^{19}$ cm$^{-3}$. Then, assuming $\sigma$ of $2*10^{-18}$ cm$^2$ and path length of 1 cm, the change in transmittance from 60% concentration to 59.5% concentration may be provided by $$\Delta t = t_{59.5\%} - t_{60\%} = 3*10^{-14} \quad (4)$$

where $\Delta t$ is the change in transmittance, $t_{59.5\%}$ is the transmittance at 59.5% concentration, and $t_{60\%}$ is the transmittance at 60% concentration.

Equation (4) implies strong limitations on the signal-to-noise ratio of the system for a gas cell of 1 cm. This type of gas cell is also described and found in other works In another type of non-dispersive infrared gas sensor, the source and detector are also in the gas cell. It would be even harder in this gas cell to achieve short pathlengths due to required placement of the source and the detector inside the gas cell.

SUMMARY

Various embodiments may provide a chemical sensor. The chemical sensor may include a first semiconductor substrate. The chemical sensor may also include a second semiconductor substrate. The chemical sensor may further include one or more metal layers between the first semiconductor substrate and the second semiconductor substrate such that the first semiconductor substrate, the second semiconductor substrate and the one or more metal layers form a cell including a cavity, the cavity having a depth of any value equal to or less than 100 The chemical sensor may also include an optical source. The chemical sensor may additionally include an optical detector such that light emitted by the optical source passes through the cell to the optical detector. The first semiconductor substrate, the second semiconductor substrate and the one or more metal layers may also define at least one inlet for fluid to flow into the cavity and at least one outlet for fluid to flow out of the cavity.

Various embodiments may provide a method of forming a chemical sensor. The method may include forming one or more metal layers between a first semiconductor substrate and a second semiconductor substrate such that the first semiconductor substrate, the second semiconductor substrate and the one or more metal layers form a cell including a cavity, the cavity having a depth of any value equal to or less than 100 The method may also include providing an optical source. The method may further include providing an optical detector such that light emitted by the optical source passes through the cell to the optical detector. The first semiconductor substrate, the second semiconductor substrate and the one or more metal layers may also define at least one inlet for fluid to flow into the cavity and at least one outlet for fluid to flow out of the cavity.

BRIEF DESCRIPTION OF THE DRAWINGS

The invention will be better understood with reference to the detailed description when considered in conjunction with the non-limiting examples and the accompanying drawings, in which:

FIG. 5D is a cross-sectional schematic illustrating the removal of the photoresist layer according to various embodiments.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or chemical sensor are analogously valid for the other methods or chemical sensors. Similarly, embodiments described in the context of a method are analogously valid for a chemical sensor, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The device as described herein may be operable in various orientations, and thus it should be understood that the terms "top", "bottom", etc., when used in the following description are used for convenience and to aid understanding of relative positions or directions, and not intended to limit the orientation of the sensor.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

Figure 1:
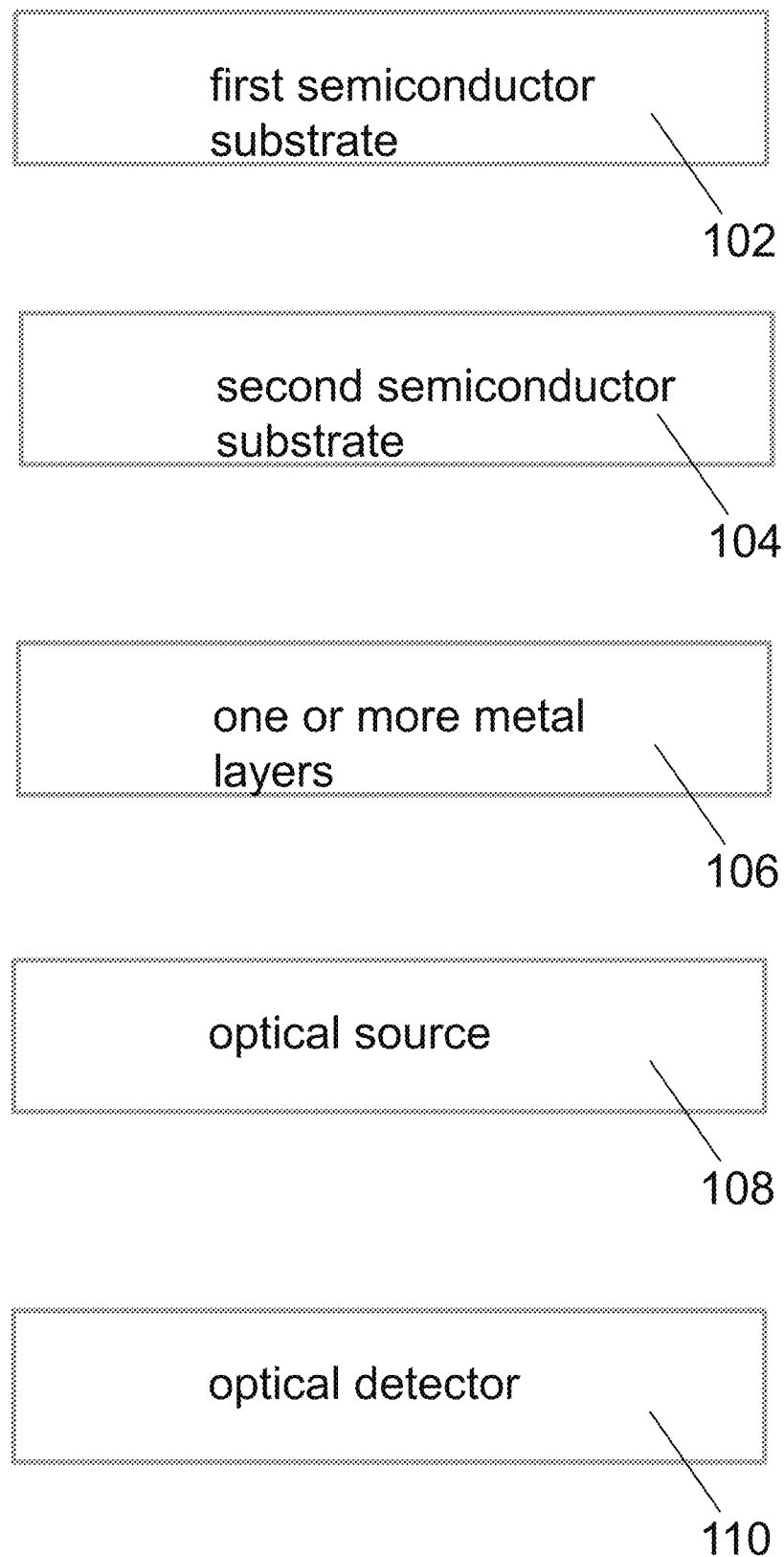
FIG. 1 is a general illustration of a chemical sensor according to various embodiments.

FIG. 1 is a general illustration of a chemical sensor according to various embodiments. The chemical sensor may include a first semiconductor substrate 102. The chemical sensor may also include a second semiconductor substrate 104. The chemical sensor may further include one or more metal layers 106 between the first semiconductor substrate 102 and the second semiconductor substrate 104 such that the first semiconductor substrate 102, the second semiconductor substrate 104 and the one or more metal layers 106 form a cell including a cavity, the cavity having a depth of any value equal to or less than 100 µm. The chemical sensor may also include an optical source 108. The chemical sensor may additionally include an optical detector 110 such that light emitted by the optical source 108 passes through the cell to the optical detector 110. The first semiconductor substrate 102, the second semiconductor substrate 104 and the one or more metal layers 106 may also define at least one inlet for fluid to flow into the cavity and at least one outlet for fluid to flow out of the cavity.

In other words, the chemical sensor may include a cell which is formed by bonding or adhering the first semiconductor substrate 102 and the second semiconductor substrate 104 together via one or more metal layers 106. The chemical sensor may also include an optical source and an optical detector such that light from the optical source 108 passes through the cell or cavity, to the optical detector 110.

For avoidance of doubt, FIG. 1 serves to illustrate some features of a chemical sensor according to various embodiments, and is not intended to limit the shape, size, arrangement, orientation etc. of the various features.

Various embodiments may relate to very short pathlength gas cells which can be precisely fabricated in order to measure accurately the difference in concentration at high concentrations. For example, in order to measure the concentration change of a gas between 60% and 59.5%, a pathlength of 100 um may enable a change in transmittance of 0.002 ($\Delta t=0.002$), meaning almost 11 orders of magnitude higher in change compared to a 1 cm pathlength gas cell. Furthermore, with even higher number densities such as at higher pressures or liquids, the pathlength required may be even smaller to enable higher transmittance change to be recorded. Pathlengths on the order of microns cannot be manufactured accurately with current, conventional gas cells.

Various embodiments may relate to or include wafer level gas or chemical cells. Various other embodiments may relate to or include chip level gas or chemical cells.

In various embodiments, the cavity may have a depth of any value less than 100 μm.

In various embodiments, the chemical sensor may have a first non-metal layer at a first inner surface adjoining the cavity. The first non-metal layer may, for instance, include an oxide (e.g. silicon oxide SiO2), a nitride (e.g. silicon nitride $Si_3N_4$), or parylene. The chemical sensor may have a second non-metal layer at a second inner surface adjoining the cavity. The second non-metal layer may, for instance, include an oxide (e.g. silicon oxide SiO2), a nitride (e.g. silicon nitride $Si_3N_4$), or parylene.

In various embodiments, the first semiconductor substrate 102 and the second semiconductor substrate 104 may include a suitable semiconductor material such as silicon or germanium.

In various embodiments, the one or more metal layers 106 may include a first adhesion layer in contact with at least a portion of the first semiconductor substrate 102. The one or more metal layers 106 may also include a first bonding layer in contact with the first adhesion layer. The one or more metal layers may additionally include a second bonding layer in contact with the first bonding layer. The one or more metal layers may further include a second adhesion layer in contact with at least a portion of the second semiconductor substrate 104.

The first adhesion layer and the second adhesion layer may include any suitable metal or metals. In various embodiments, the first adhesion layer and the second adhesion layer may include chromium or titanium. In various other embodiments, the first adhesion layer and the second adhesion layer may be seed layers for electroplating, and may include chromium or titanium together with copper.

The first bonding layer and the second bonding layer may include any suitable metal or metals. In various embodiments, the first bonding layer and the second bonding layer may include gold. In various other embodiments, the first bonding layer and the second bonding layer may include aluminum or copper.

In various embodiments, the first semiconductor substrate 102, the second semiconductor substrate 104 and the one or more metal layers 106 may form a further cell including a further cavity.

In various embodiments, the further cavity may be sealed. The chemical sensor may not have an inlet and an outlet connected to the further cavity. The further cell may be used as a reference cell, while the cell may be used as a measurement cell.

In various other embodiments, the first semiconductor substrate 102, the second semiconductor substrate 104 and the metal layer 106 may also define at least one further inlet for fluid to flow into the further cavity and at least one further outlet for fluid to flow out of the further cavity. The further cell may also be used as a measurement cell.

In various embodiments, the chemical sensor may include one or more measurement cells. The chemical sensor may or may not include one or more reference cells.

In various embodiments, the chemical sensor may include a further optical detector such that light emitted by the optical source 108 passes through the further cell to the further optical detector. In various embodiments, the optical source 108 and the optical detector 110 may be unpackaged dies bonded to the cell using wafer to wafer bonding methods or chip to wafer bonding methods. In various embodiments, the further optical detector may also be an unpackaged die bonded to the further cell. The optical source 108 may also be bonded to the further cell.

Figure 2:
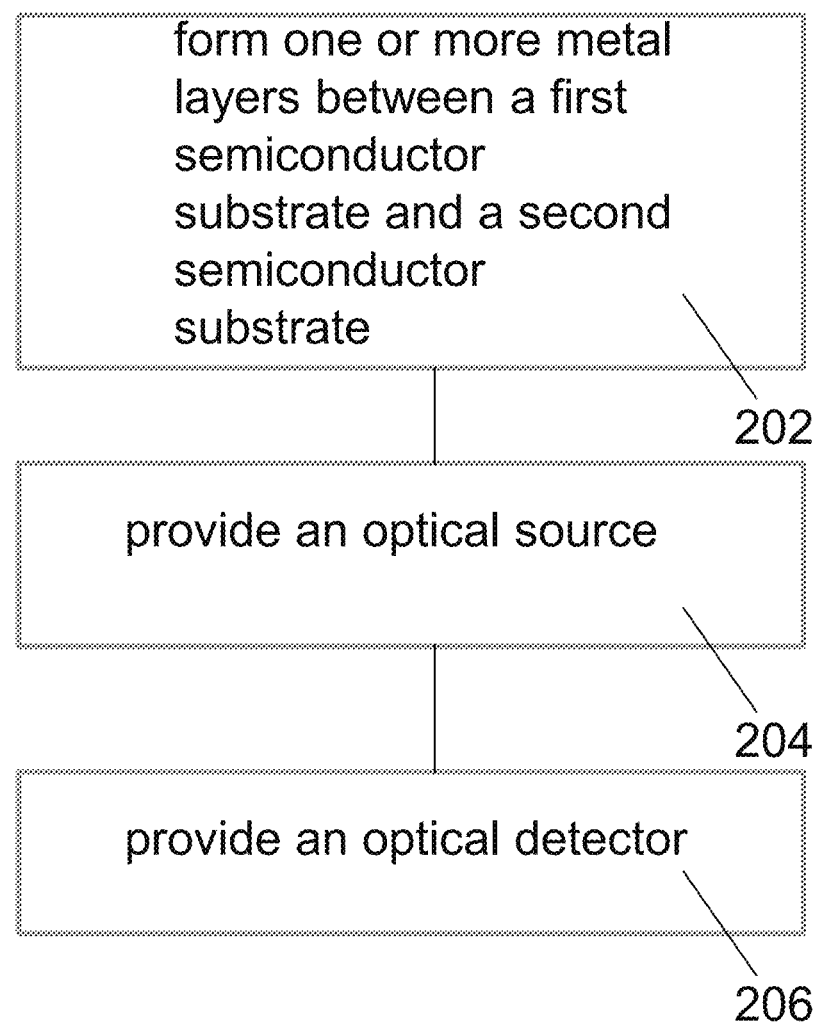
FIG. 2 is a general illustration of a method of forming a chemical sensor according to various embodiments.

FIG. 2 is a general illustration of a method of forming a chemical sensor according to various embodiments. The method may include, in 202, forming one or more metal layers between a first semiconductor substrate and a second semiconductor substrate such that the first semiconductor substrate, the second semiconductor substrate and the one or more metal layers form a cell including a cavity. The cavity may have a depth of any value equal to or less than 100 μm. The method may also include, in 204, providing an optical source. The method may further include, in 206, providing an optical detector such that light emitted by the optical source passes through the cell to the optical detector. The first semiconductor substrate, the second semiconductor substrate and the one or more metal layers may also define at least one inlet for fluid to flow into the cavity and at least one outlet for fluid to flow out of the cavity.

In other words, the method may include forming a cell with a cavity by bonding or adhering the first semiconductor substrate and the second semiconductor substrate together using one or more metal layers. The cavity may have a depth of any value equal to or less than 100 μm. The method may also include providing an optical source and an optical detector such that light from the optical source passes through the cell or cavity, to the optical detector.

For avoidance of doubt, the steps shown in FIG. 2 may or may not be in sequence. For instance, step 206 may be after, before or at the same time as step 204.

In various embodiments, the cavity may have a depth of any value less than 100 μm.

In various embodiments, the first semiconductor substrate and the second semiconductor substrate may include a suitable semiconductor material such as silicon or germanium.

In various embodiments, the first semiconductor substrate may be patterned before forming a first adhesion layer of the one or more metal layers in contact with the first semiconductor substrate and forming a first bonding layer of the one or more metal layers in contact with the first adhesion layer. The second semiconductor substrate may be patterned before forming a second adhesion layer of the one or more metal layers in contact with the first second semiconductor substrate, and forming a second bonding layer of the one or more metal layers in contact with the second adhesion layer. The method may further include bonding the first bonding layer and the second bonding layer to form the cell including the cavity.

The first adhesion layer and the second adhesion layer may include any suitable metal or metals. In various embodiments, the first adhesion layer and the second adhesion layer may include chromium or titanium. In various other embodiments, the first adhesion layer and the second adhesion layer may be seed layers for electroplating may include chromium or titanium together with copper.

The first bonding layer and the second bonding layer may include any suitable metal or metals. In various embodiments, the first bonding layer and the second bonding layer may include gold. In various embodiments, forming the first bonding layer and the second bonding layer may including depositing the suitable metal or metals via sputtering. In various other embodiments, forming the first bonding layer and the second bonding layer may including depositing the suitable metal or metals via electroplating.

In various embodiments, the first semiconductor substrate, the second semiconductor substrate and the one or more metal layers may form a further cell including a further cavity.

In various embodiments, the further cavity may be sealed. The chemical sensor may not have an inlet and an outlet connected to the further cavity. The further cell may be used as a reference cell, while the cell may be used as a measurement cell.

In various other embodiments, the first semiconductor substrate, the second semiconductor substrate and the metal layer may also define at least one further inlet for fluid to flow into the further cavity and at least one further outlet for fluid to flow out of the further cavity. The further cell may also be used as a measurement cell.

In various embodiments, the chemical sensor may include one or more measurement cells. The chemical sensor may or may not include one or more reference cells.

In various embodiments, the method may include providing a further optical detector such that light emitted by the optical source passes through the further cell to the further optical detector.

Figure 3A:
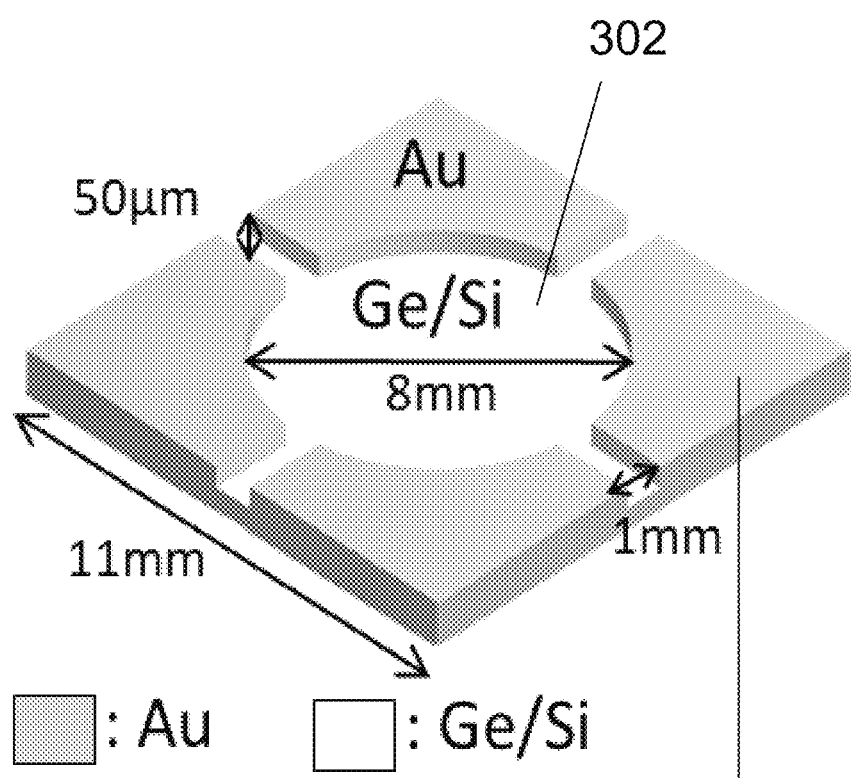
FIG. 3A shows a cut-away perspective view of a gas or chemical cell according to various embodiments.
Figure 3B:
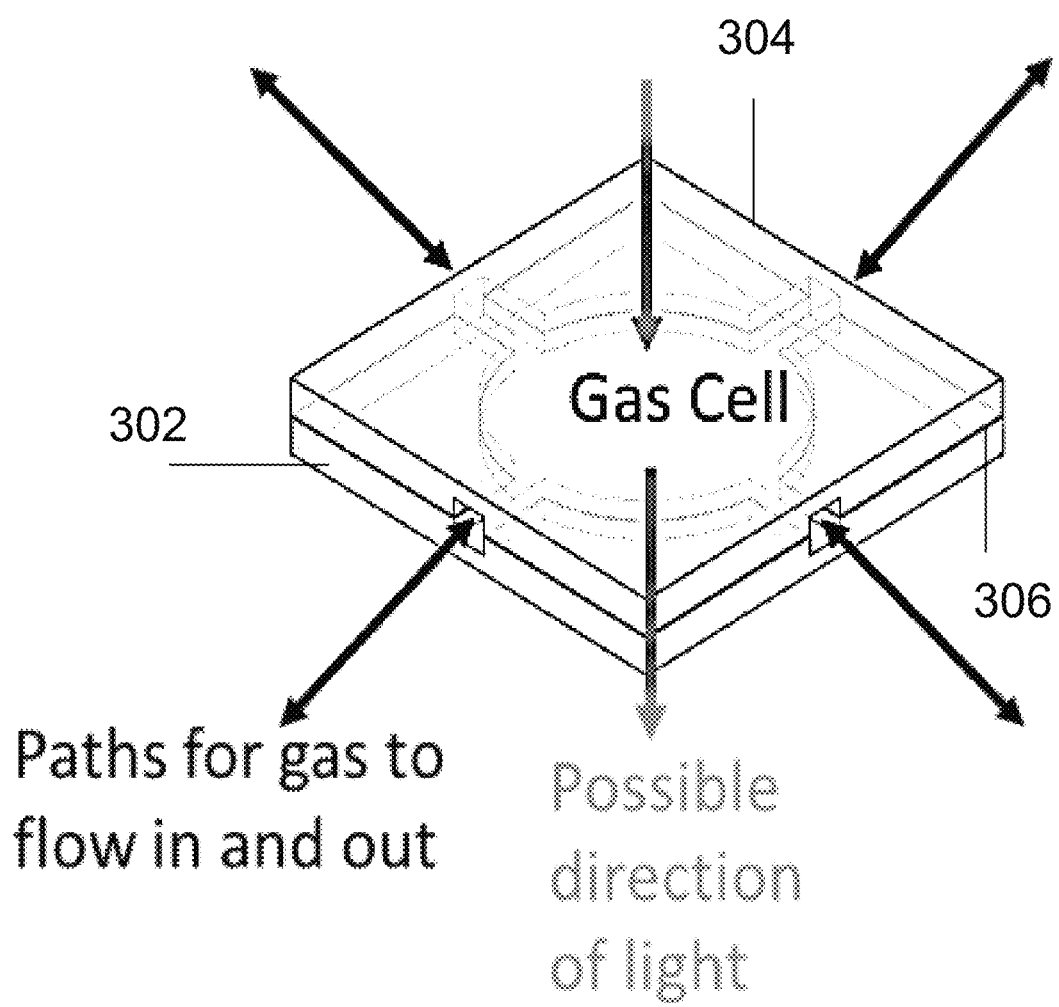
FIG. 3B shows an external perspective view of a bonded gas or chemical cell according to various embodiments.
Figure 3C:
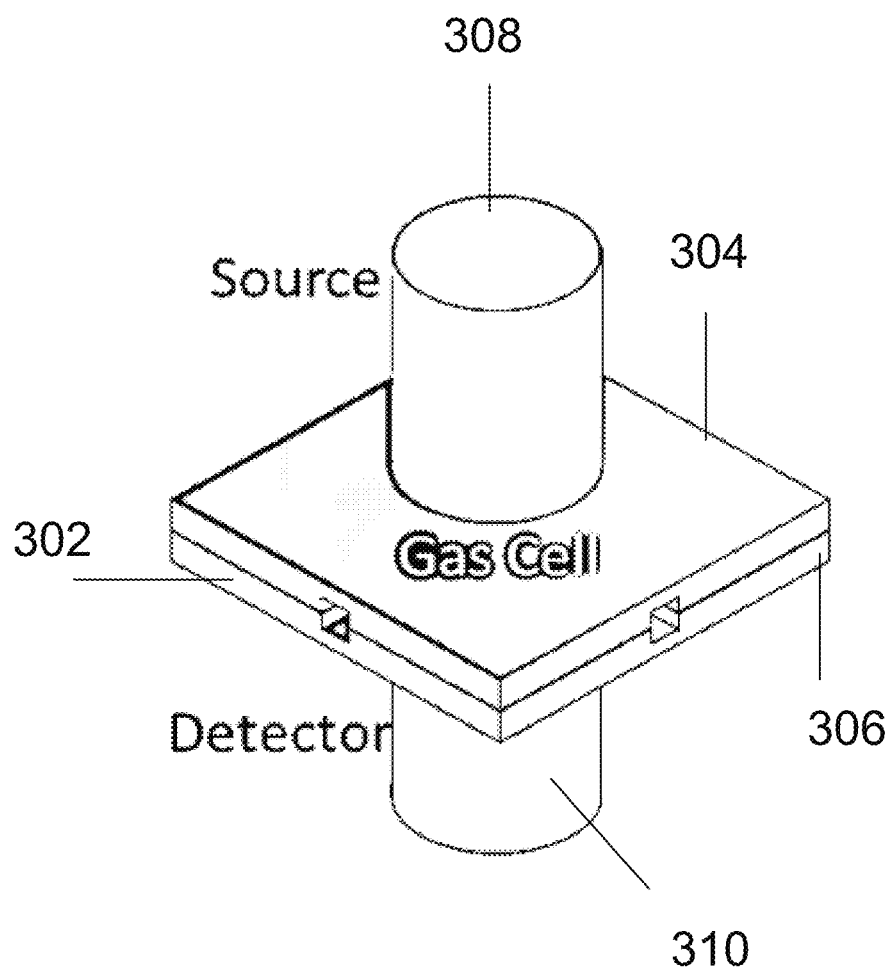
FIG. 3C shows a chemical or gas sensor including the chemical or gas cell shown in FIG. 3B and including an optical or light source and an optical detector according to various embodiments.

FIG. 3A shows a cut-away perspective view of a gas or chemical cell according to various embodiments. FIG. 3B shows an external perspective view of a bonded gas or chemical cell according to various embodiments. FIG. 3C shows a chemical or gas sensor including the chemical or gas cell shown in FIG. 3B and including an optical or light source 308 and an optical detector 310 according to various embodiments. The wafer-level gas or chemical cell may be made of two wafers patterned 302, 304 with specific depth and geometry to allow for gas to flow into the cell and also for light to be guided in this short region. In this case, as shown in FIG. 3A, a circular cavity may be etched in the wafer 302 in which the etch depth of 50 µm represents half of the desired optical path length of 100 µm. The circle may be 8 mm in diameter and the sides may include 1 mm width rectangular channels to enable gas to flow in from the sides to enter the cell. This four-fold rotational symmetry may enable easy placement of the cell. Also, a metal layer 306 such as gold (Au) may be coated on the top surface where the metal layer will be in contact with another similar metal layer 306 (e.g. gold) to bond both wafers 302, 304 together. Gold (Au) may be used to perform thermocompression bonding without requirement to prepare the surface since gold would not be oxidized. Thermocompression bonding may help to seal the wafers 302, 304 together to prevent fluid or gas from leaking out and interacting with the source or detector or other electrical components. This may be crucial since the fluid or gas maybe corrosive. Gold may also be resistant to many chemicals and gases, thus protecting the underlying substrate. At the same time, the gold may be also deposited at the sidewalls to also help guide the light from one end to the other end.

FIG. 3B also includes the path for the optical light to pass through, and path for the fluid or gas to flow and interact with the optical light. FIG. 3C shows the placement of the optical source 308 and the optical detector 310 relative to the gas cell. The chemical or gas sensor shown in FIG. 3C may be a non-dispersive infrared chemical or gas sensor. In various embodiments, both the optical source 308 and the optical detector 310 in TO-Cans may be bonded directly to the gas or chemical cell to create a vacuum seal and improve the signal-to-noise ratio (SNR) of the system. The optical source and detector may also be unpackaged dies that can be bonded to the gas or chemical cell using wafer to wafer bonding methods or chip to wafer bonding methods, which would enable low cost, mass production of the sensors.

The substrates 302, 304 of the gas or chemical cell may include materials such as silicon (Si) or germanium (Ge), which may be selected to ensure maximum transparency in the electromagnetic wavelength(s) of interest. The electromagnetic wavelength(s) of interest may correspond to the resonance frequency of the vibrational or rotational bond of the target species. Gold (Au) may be selected to act as a guiding layer for the electromagnetic waves, and also to serve as a bonding layer to enable wafers/chips to be bonded together.

Figure 4A:
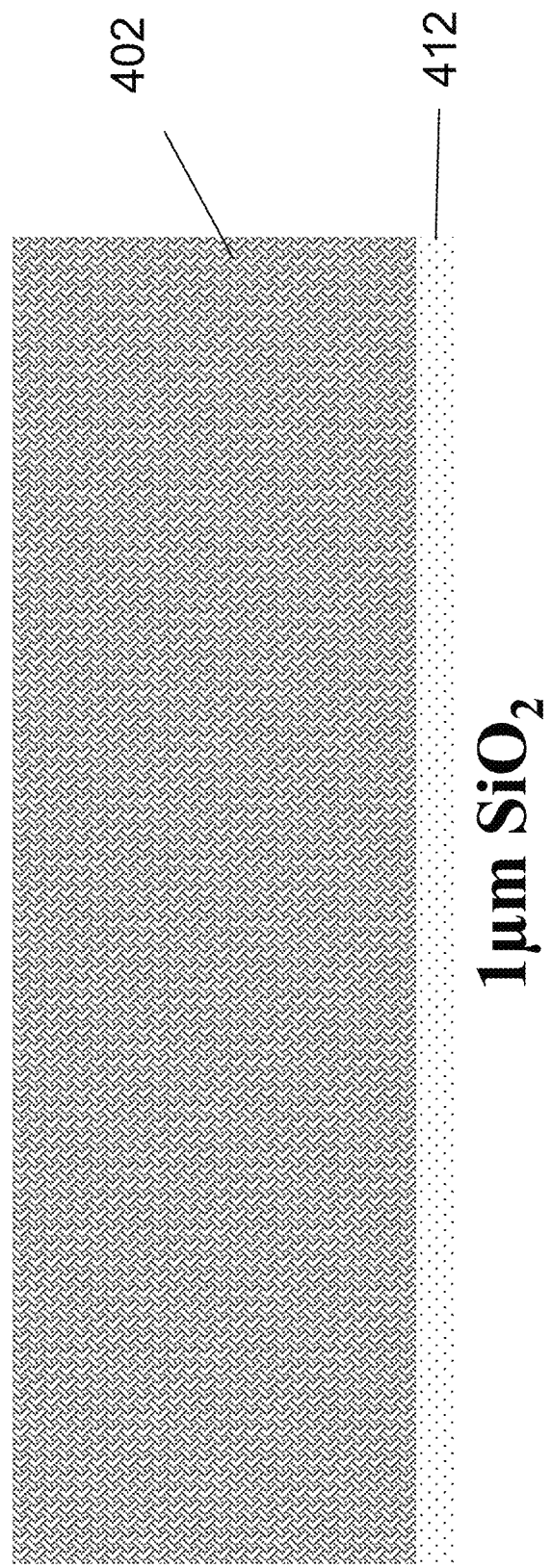
FIG. 4A is a cross-sectional schematic illustrating the deposition of silicon oxide (SiO$_2$) on one side of a substrate according to various embodiments.

FIGS. 4A-H illustrate the fabrication of a gas or chemical cell according to various embodiments by physical deposition of the metals. FIG. 4A is a cross-sectional schematic illustrating the deposition of silicon oxide ($SiO_2$) on one side of a substrate 402 according to various embodiments. The deposition of silicon oxide ($SiO_2$) to form a silicon oxide ($SiO_2$) layer 412 on a backside of the substrate 402 may be optional. The silicon oxide ($SiO_2$) layer 412 may serve to act as either an anti-reflection coating or chemical coating. The substrate 402 may include silicon (Si) or germanium (Ge).

Figure 4B:
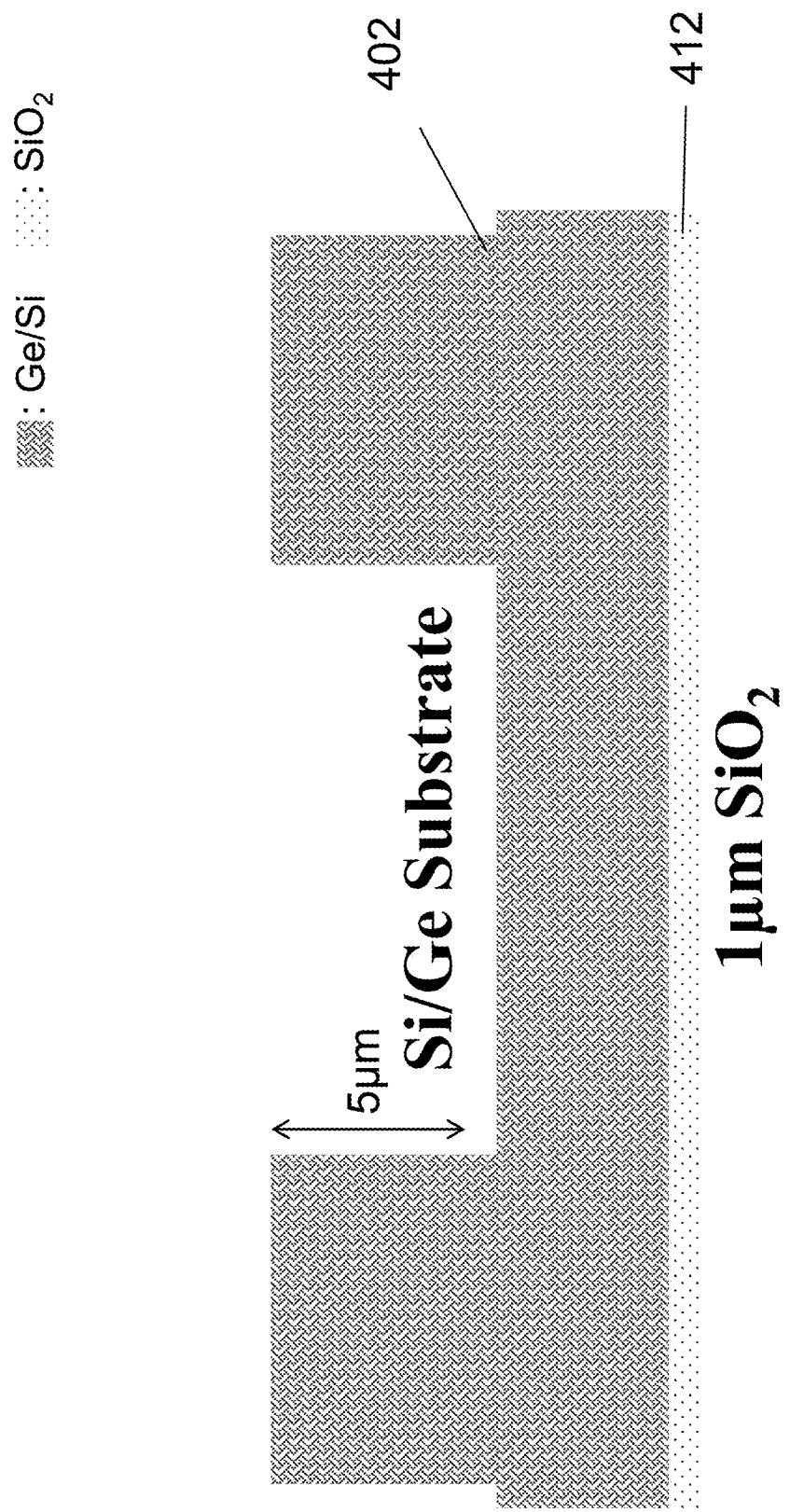
FIG. 4B is a cross-sectional schematic illustrating the patterning and etching of the substrate according to various embodiments.

FIG. 4B is a cross-sectional schematic illustrating the patterning and etching of the substrate 402 according to various embodiments. A hole may be formed on the substrate 402.

Figure 4C:
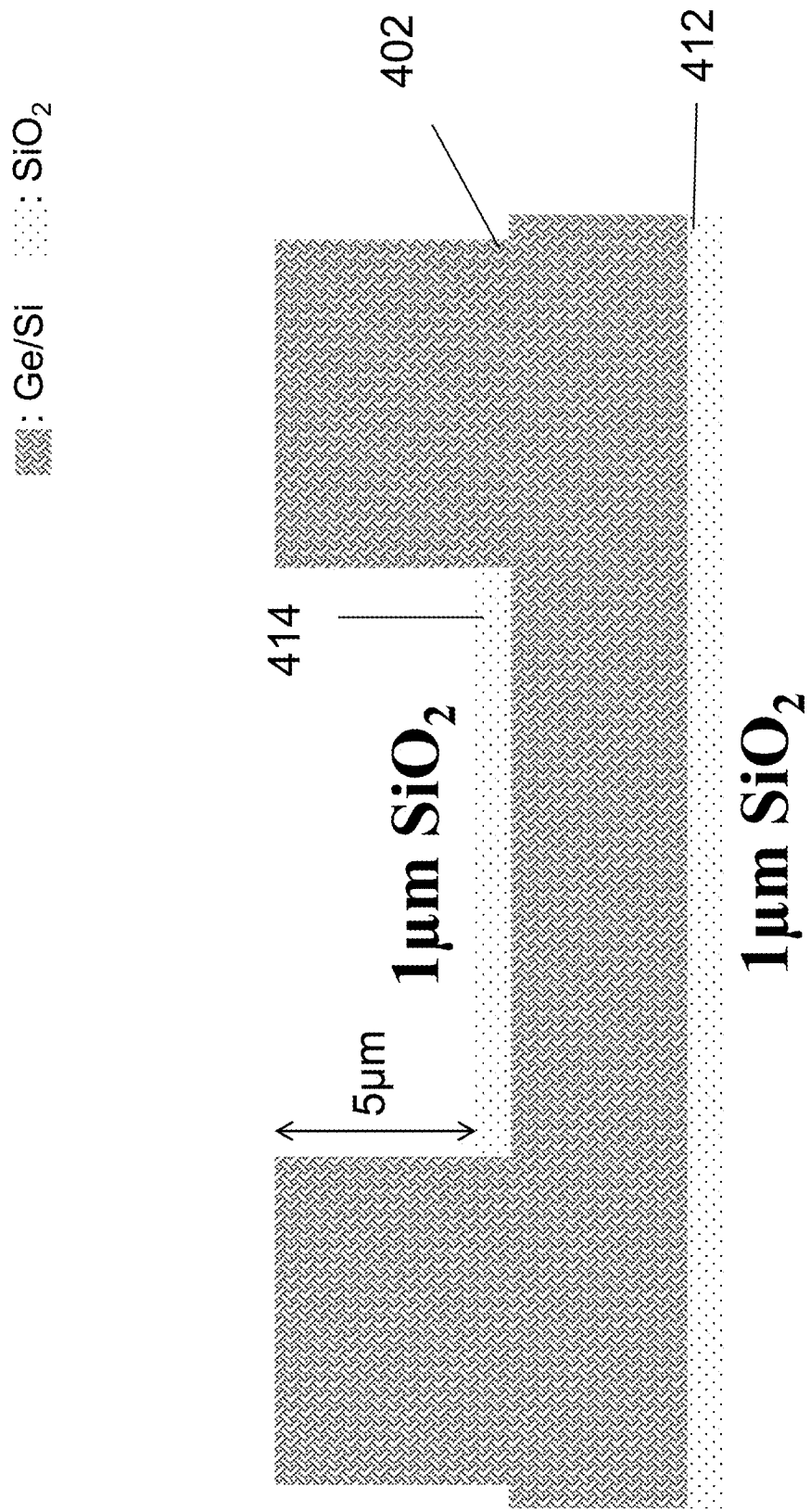
FIG. 4C is a cross-sectional schematic illustrating the deposition of silicon oxide (SiO$_2$) on an opposing side of a substrate according to various embodiments.

FIG. 4C is a cross-sectional schematic illustrating the deposition of silicon oxide ($SiO_2$) on an opposing side of a substrate 402 according to various embodiments. The deposition of silicon oxide ($SiO_2$), followed by subsequent patterning and etching to form a silicon oxide ($SiO_2$) layer 414 on a front side of the substrate 402, i.e. within the hole, may be optional. The silicon oxide ($SiO_2$) layer 414 may serve to act as either an anti-reflection coating or chemical coating. In various other embodiments, instead of $SiO_2$, another non-metal material such as a nitride (e.g. silicon nitride $Si_3N_4$), another oxide, or parylene may be deposited to form the layer 414.

Figure 4D:
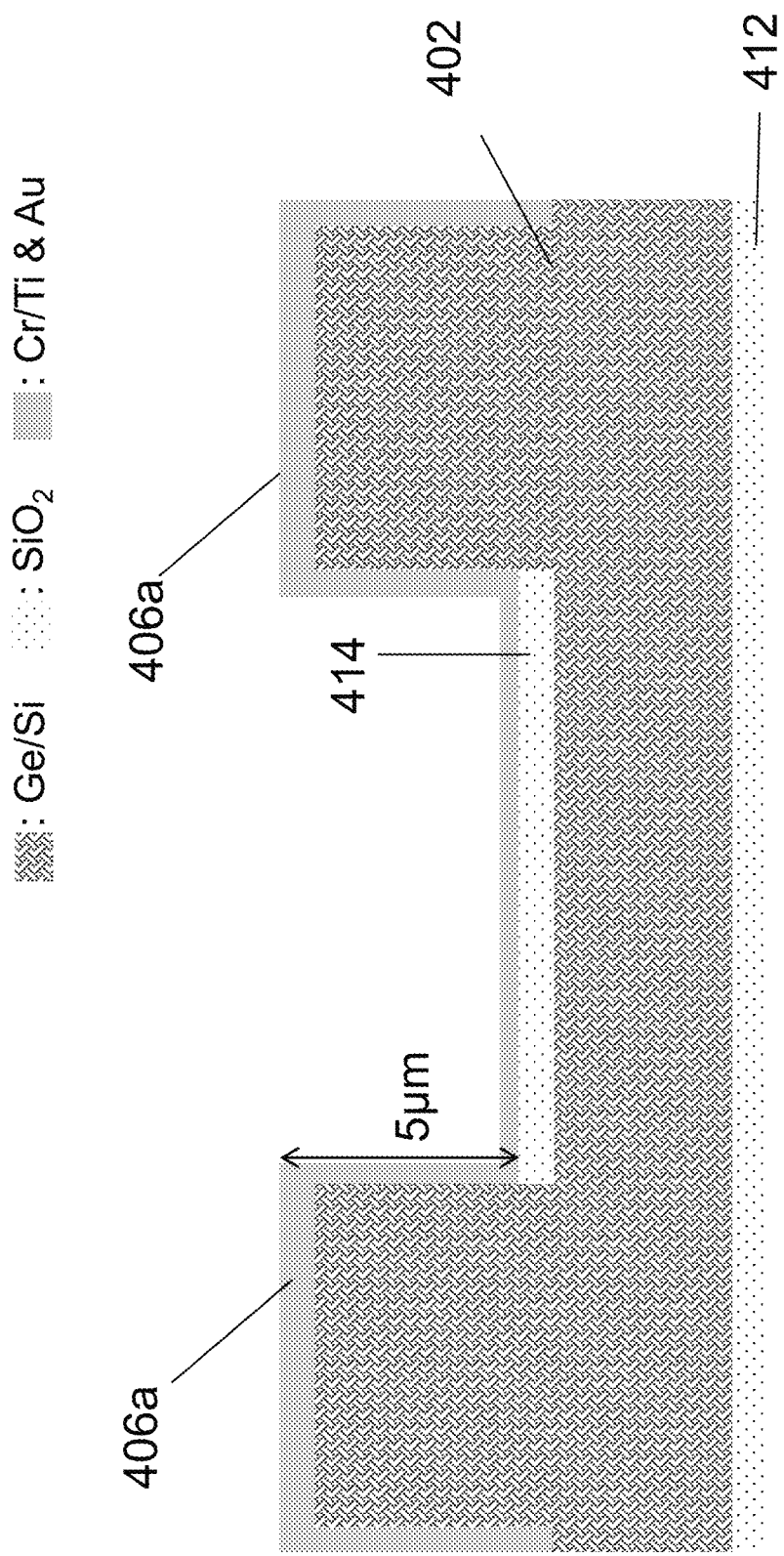
FIG. 4D is a cross-sectional schematic illustrating the deposition of chromium/titanium (Cr/Ti) and gold (Au) according to various embodiments.

FIG. 4D is a cross-sectional schematic illustrating the deposition of chromium/titanium (Cr/Ti) and gold (Au) according to various embodiments. Chromium/titanium (Cr/Ti) may be deposited first, followed by gold (Au). The deposition of chromium/titanium (Cr/Ti) and gold (Au) may form metal layers 406a on the front side of the substrate 402.

Figure 4E:
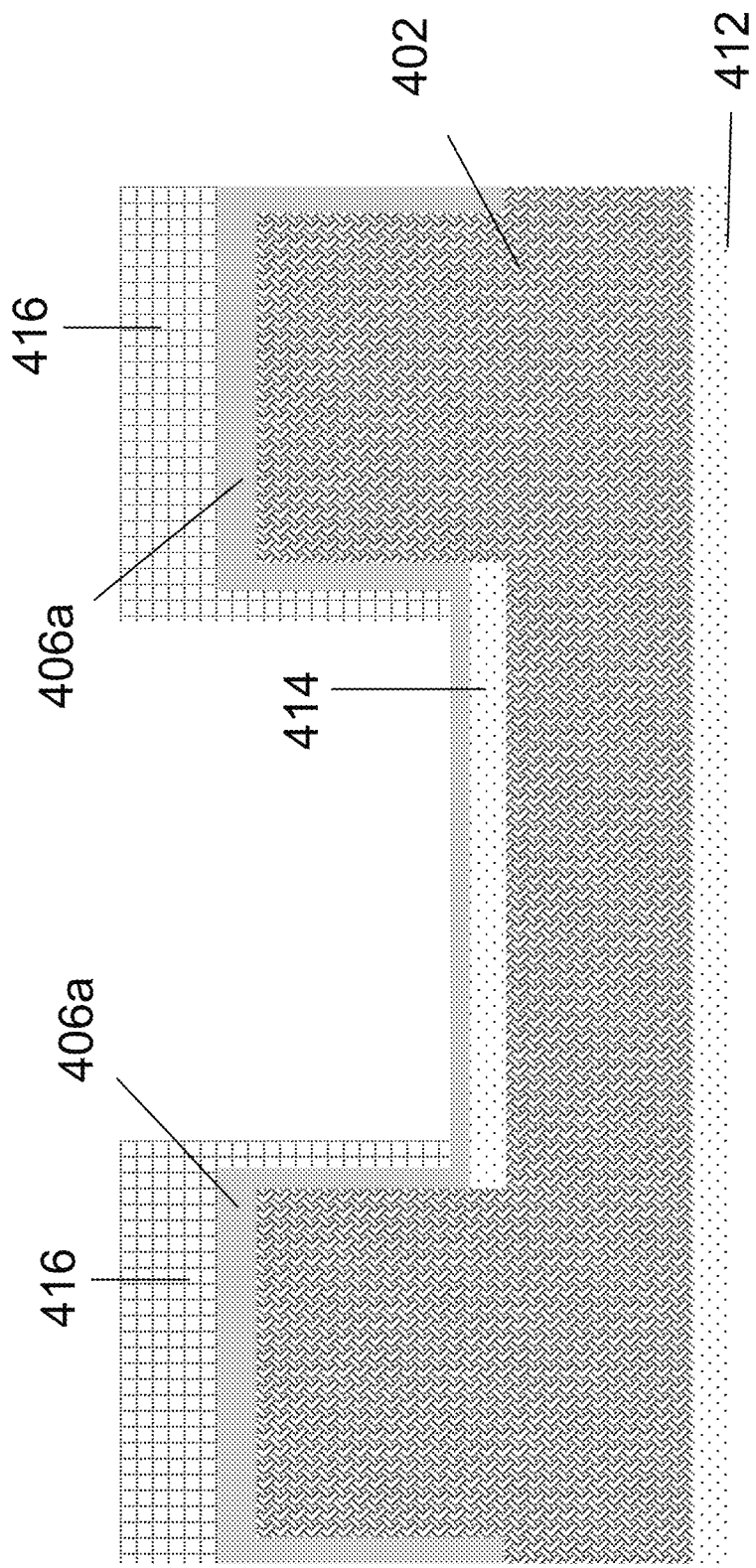
FIG. 4E is a cross-sectional schematic illustrating the deposition of a layer of photoresist (PR) according to various embodiments.

FIG. 4E is a cross-sectional schematic illustrating the deposition of a layer of photoresist (PR) 416 according to various embodiments. Portions of the layer of photoresist (PR) 416 may then be patterned to expose portions of the underlying metal layers 406a.

Figure 4F:
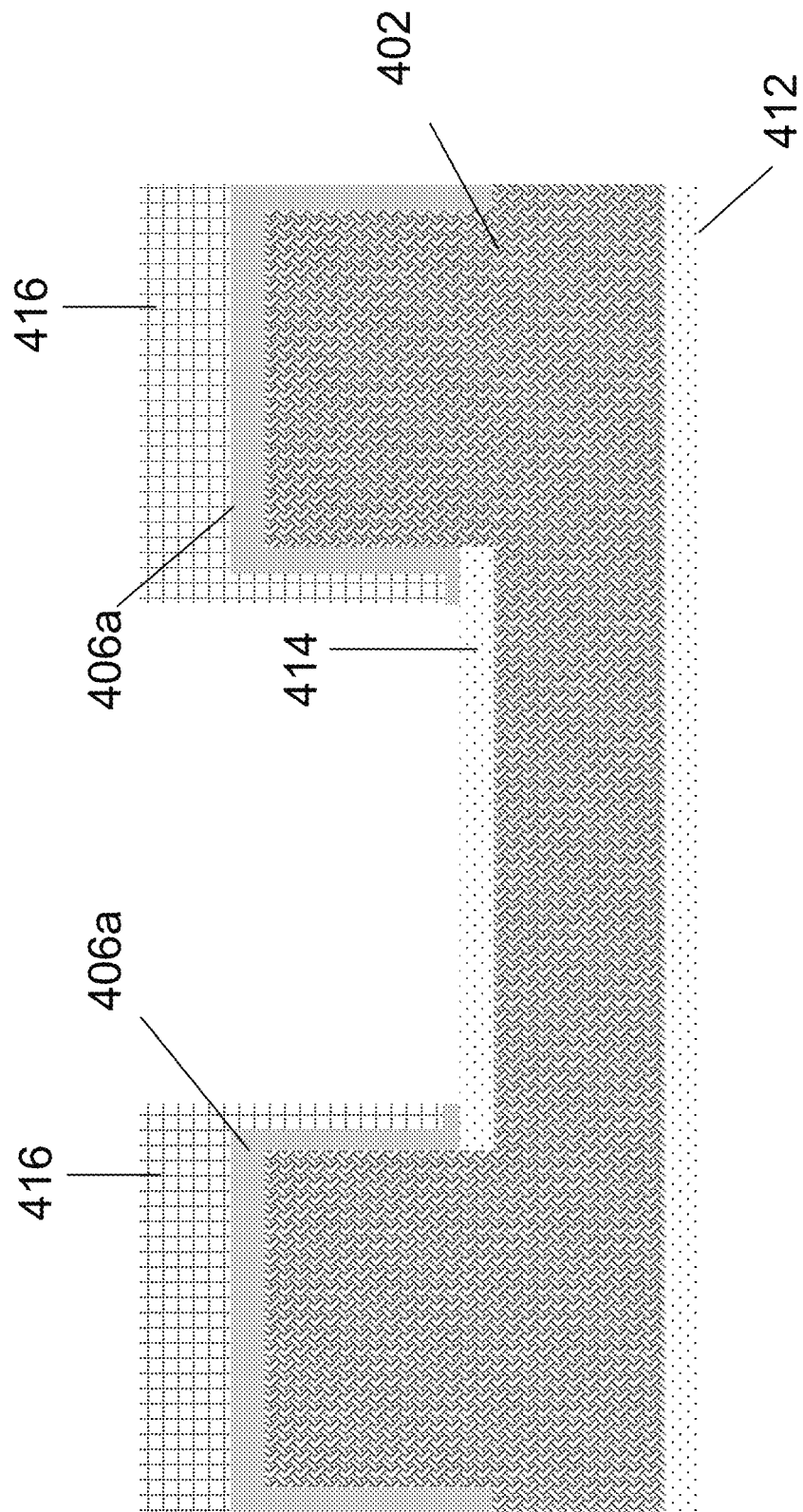
FIG. 4F is a cross-sectional schematic illustrating the patterning and etching of gold (Au) according to various embodiments.

FIG. 4F is a cross-sectional schematic illustrating the patterning and etching of gold (Au) according to various embodiments. In addition to the etching of gold, the underlying Cr/Ti may also be etched. The exposed portions of the metal layers 406a, i.e. the Cr/Ti and Au layers, not covered by the photoresist 416 may be etched.

Figure 4G:
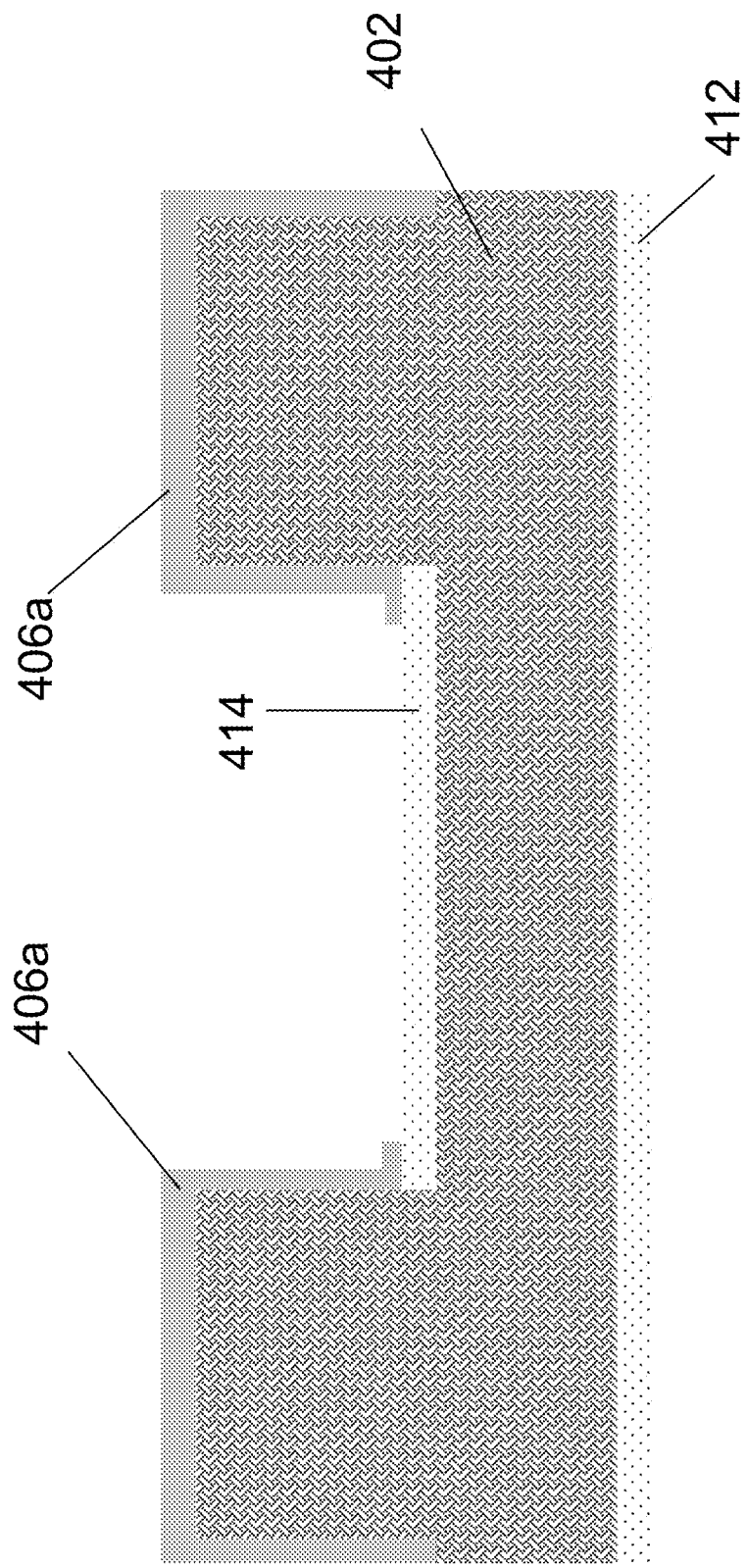
FIG. 4G is a cross-sectional schematic illustrating the removal of the patterned photoresist layer according to various embodiments.

FIG. 4G is a cross-sectional schematic illustrating the removal of the patterned photoresist layer 416 according to various embodiments.

Figure 4H:
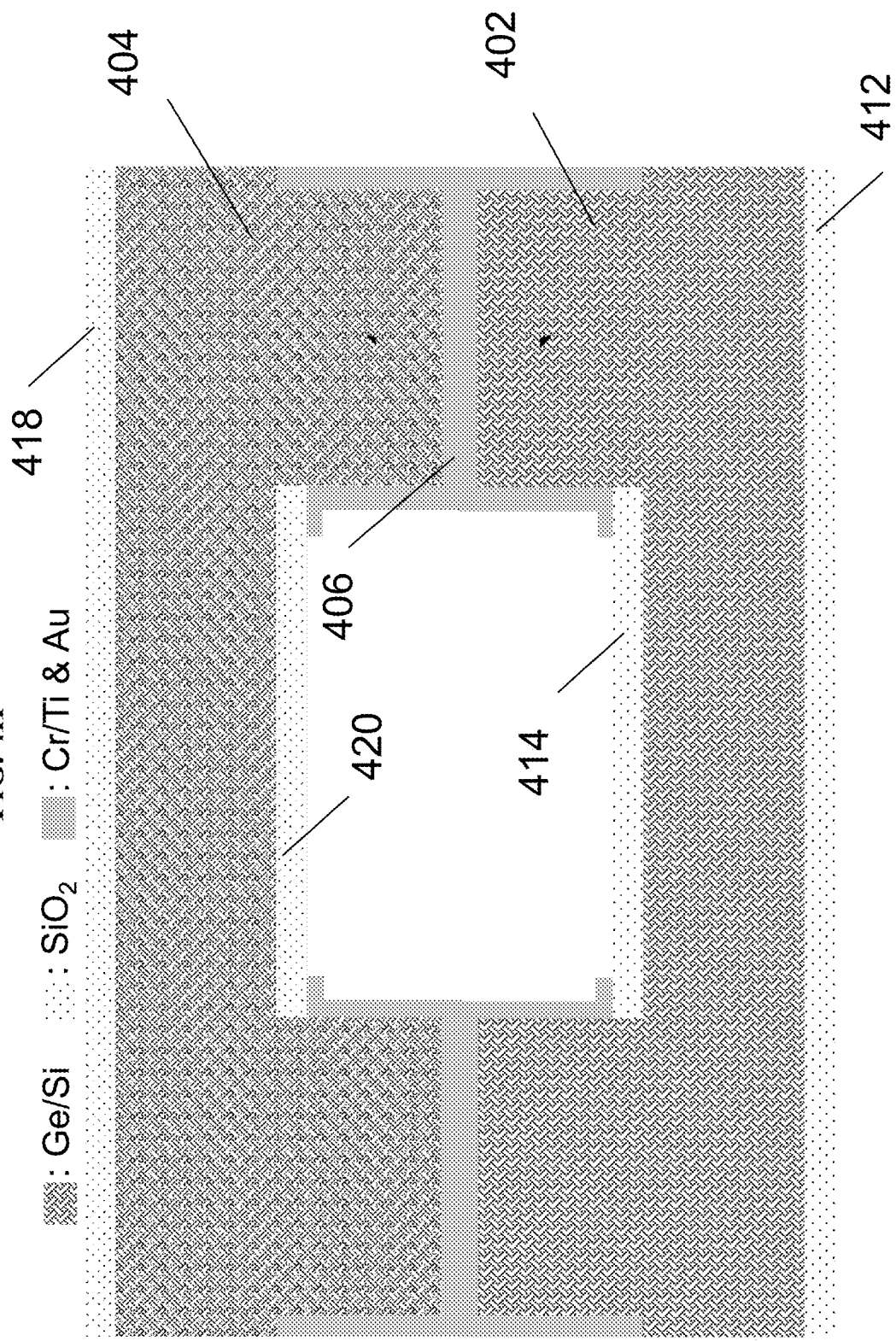
FIG. 4H is a cross-sectional schematic illustrating the bonding of substrates to form a gas or chemical cell according to various embodiments.

FIG. 4H is a cross-sectional schematic illustrating the bonding of substrates 402, 404 to form a gas or chemical cell according to various embodiments. Another substrate 404 may be formed in a similar manner as substrate 402 shown in FIGS. 4A-G. A silicon oxide ($SiO_2$) layer 418 may be formed on a backside of the substrate 404, while another silicon oxide ($SiO_2$) layer 420 may be formed on a frontside of the substrate 404. Metal layers of chromium/titanium (Cr/Ti) and gold (Au) may also be formed on the front side of the substrate 404. The metal layers 406a formed on the front side of the substate 402 and the metal layers formed on the front side of the substrate 404 may be bonded together. The holes on substrates 402, 404 may together form a cavity. As shown in FIG. 4F, the metal layers 406a formed on the front side of the substate 402 and the metal layers formed on the front side of the substrate 404 may collectively be referred to as metal layers 406. The metal layers 406 may extend from between the substrates 402, 404 to the sidewalls of the cavity. In addition, the silicon oxide layer 414 may be on a first inner surface of the cavity, while the silicon oxide layer 420 may be on a second inner surface of the cavity opposite the first inner surface. The metal layers 406 on sidewalls of the cavity may join silicon oxide layer 414 to silicon oxide layer 420.

FIGS. 5A-F illustrate the fabrication of a gas or chemical cell according to various embodiments by electroplating. FIGS. 5A-F may follow FIGS. 4A-C which illustrate the initial steps of fabrication of the gas or chemical cell, and which are also applicable to forming the gas or chemical cell by electroplating.

Figure 5A:
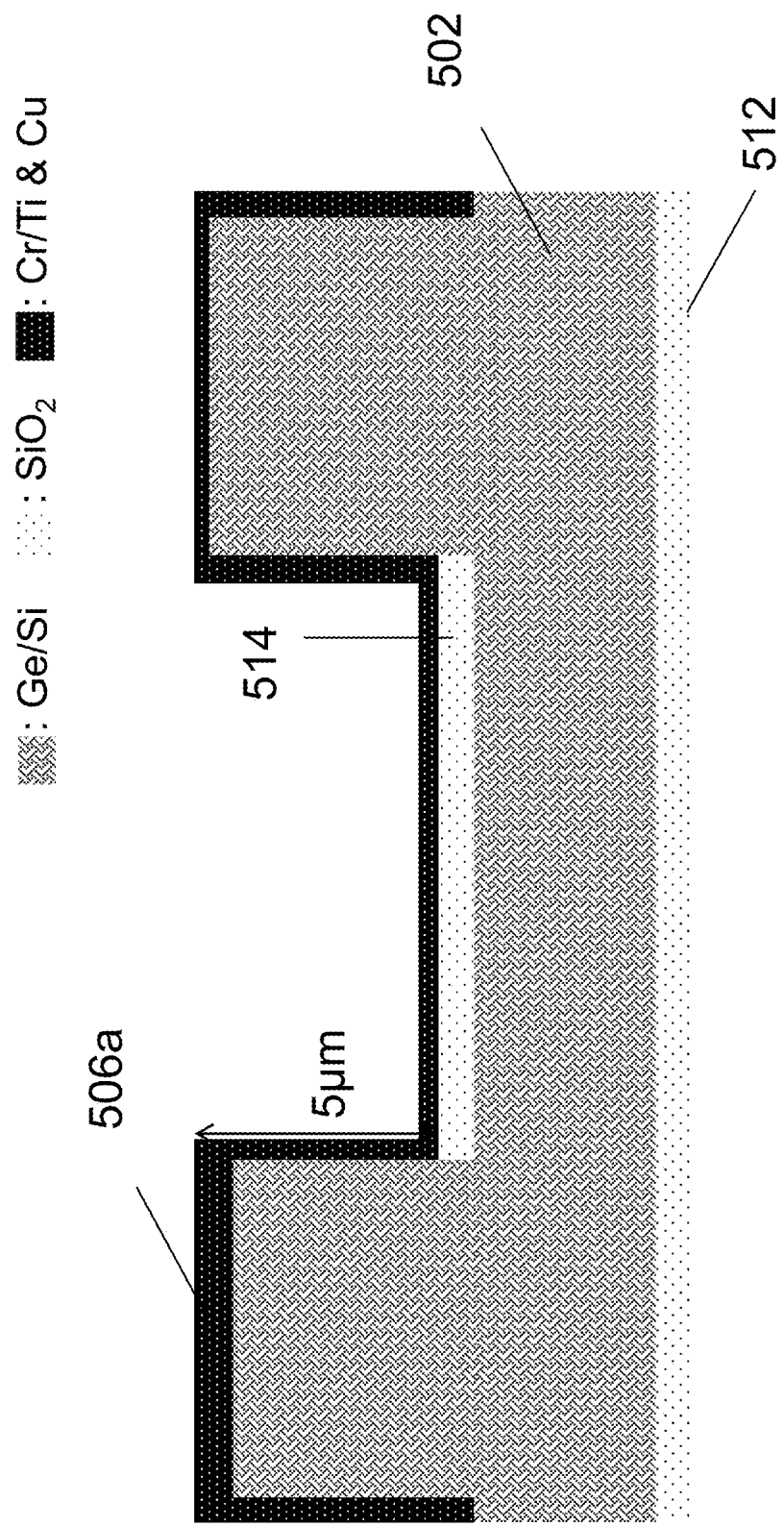
FIG. 5A is a cross-sectional schematic illustrating the deposition of chromium/titanium (Cr/Ti) and copper (Cu) over the front side of the substrate according to various embodiments.

FIG. 5A is a cross-sectional schematic illustrating the deposition of chromium/titanium (Cr/Ti) and copper (Cu) over the front side of the substrate according to various embodiments. The deposition of chromium/titanium (Cr/Ti) and copper (Cu), e.g. via sputtering, may form metal layer 506a, which may be a seed layer. FIG. 5A may follow immediately from FIG. 4C. Substrate 502 in FIG. 5A may correspond to substrate 402 in FIG. 4C, $SiO_2$ layer 512 in FIG. 5A may correspond to $SiO_2$ layer 412 in FIG. 4C, and $SiO_2$ layer 514 in FIG. 5A may correspond to $SiO_2$ layer 414 in FIG. 4C.

Figure 5B:
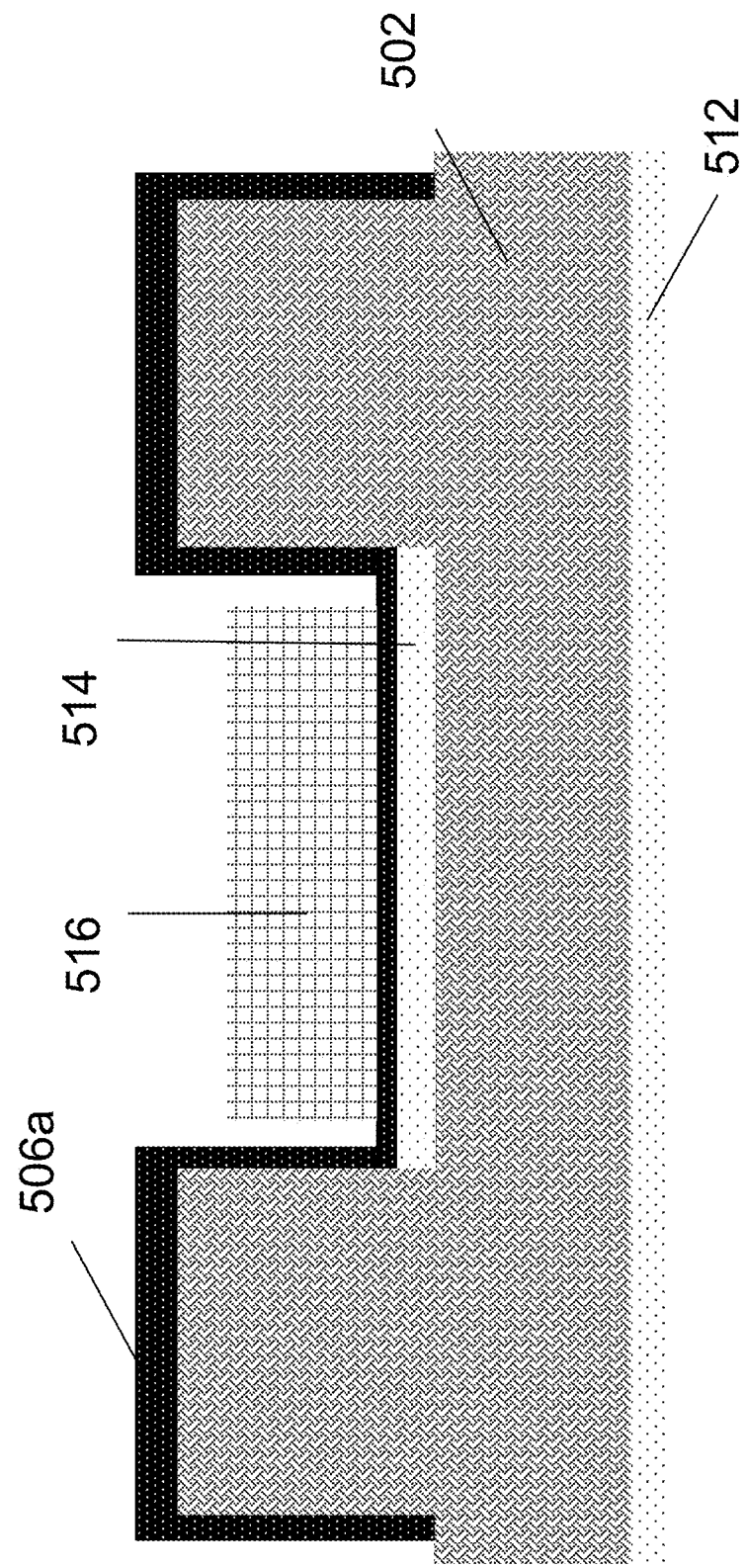
FIG. 5B is a cross-sectional schematic illustrating the deposition of a layer of photoresist (PR) according to various embodiments.

FIG. 5B is a cross-sectional schematic illustrating the deposition of a layer of photoresist (PR) 516 according to various embodiments. Photoresist may be deposited over the entire front surface, before being patterned to form photoresist layer 516 within the hole. The photoresist layer 516 may be away from the sidewalls of the hole to allow for subsequent electroplating on the sidewalls.

Figure 5C:
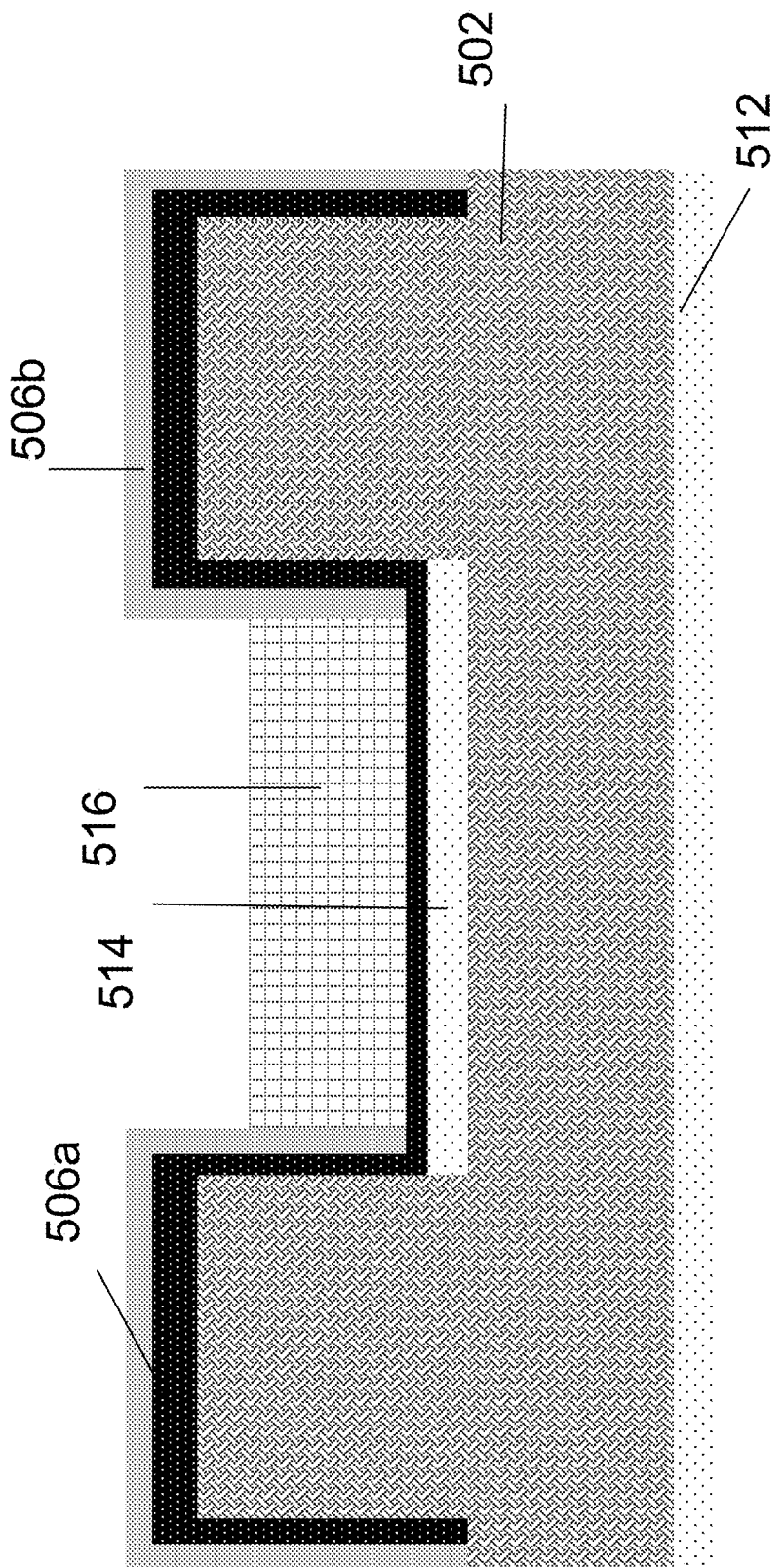
FIG. 5C is a cross-sectional schematic illustrating the electroplating of gold (Au) according to various embodiments.

FIG. 5C is a cross-sectional schematic illustrating the electroplating of gold (Au) according to various embodiments. A gold layer 506b may be formed on the seed layer 506a after electroplating.

FIG. 5D is a cross-sectional schematic illustrating the removal of the photoresist layer 516 according to various embodiments. The removal of the photoresist layer 516 may expose a portion of the seed layer 502a underlying the photoresist layer 516.

Figure 5E:
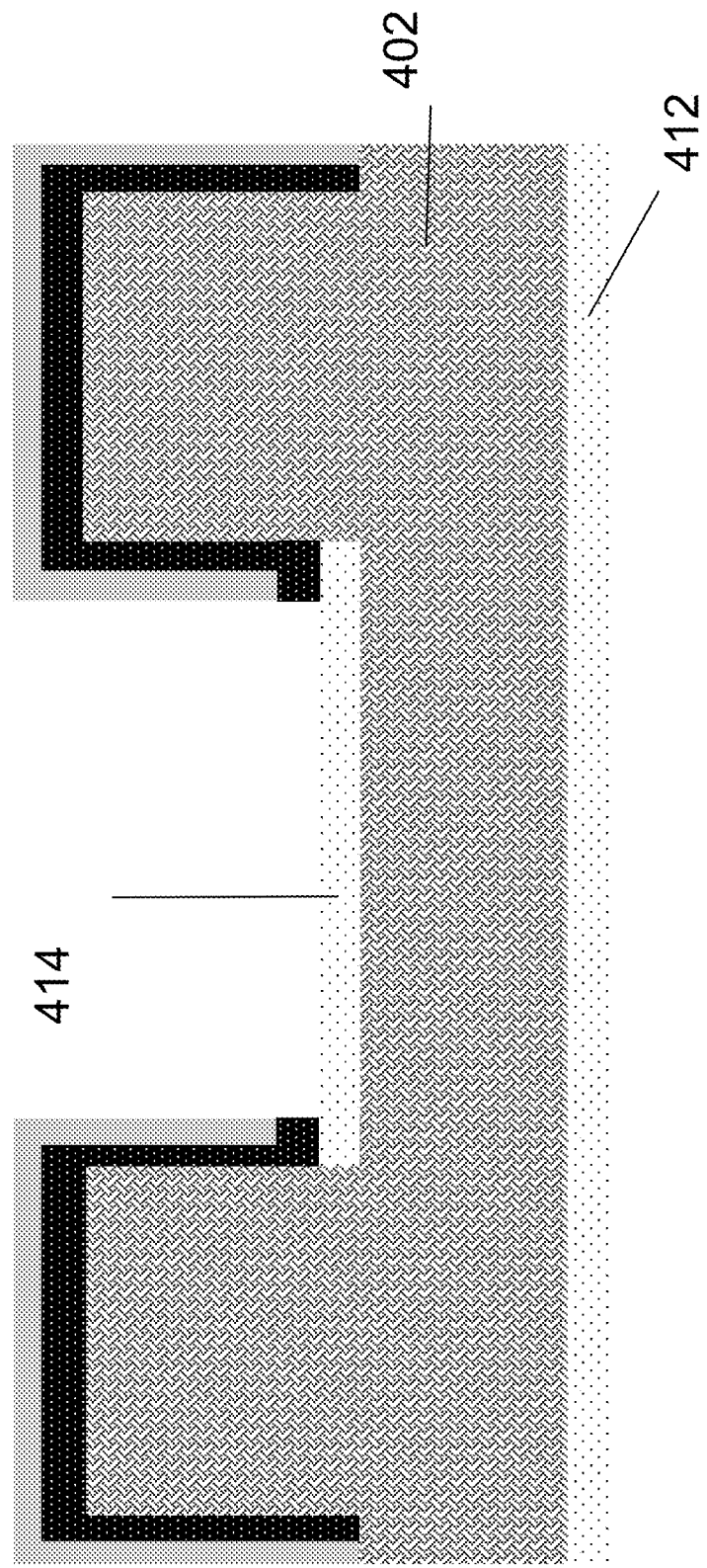
FIG. 5E is a cross-sectional schematic illustrating the removal of the portion of the seed layer underlying the photoresist layer according to various embodiments.

FIG. 5E is a cross-sectional schematic illustrating the removal of the portion of the seed layer 502a underlying the photoresist layer 516 according to various embodiments. The exposed portion of the seed layer 502a, i.e. Cr/Ti and Cu, may be removed by a wet etch. The portion of the seed layer 502a under the gold layer 502b may be protected by the gold layer 502b.

Figure 5F:
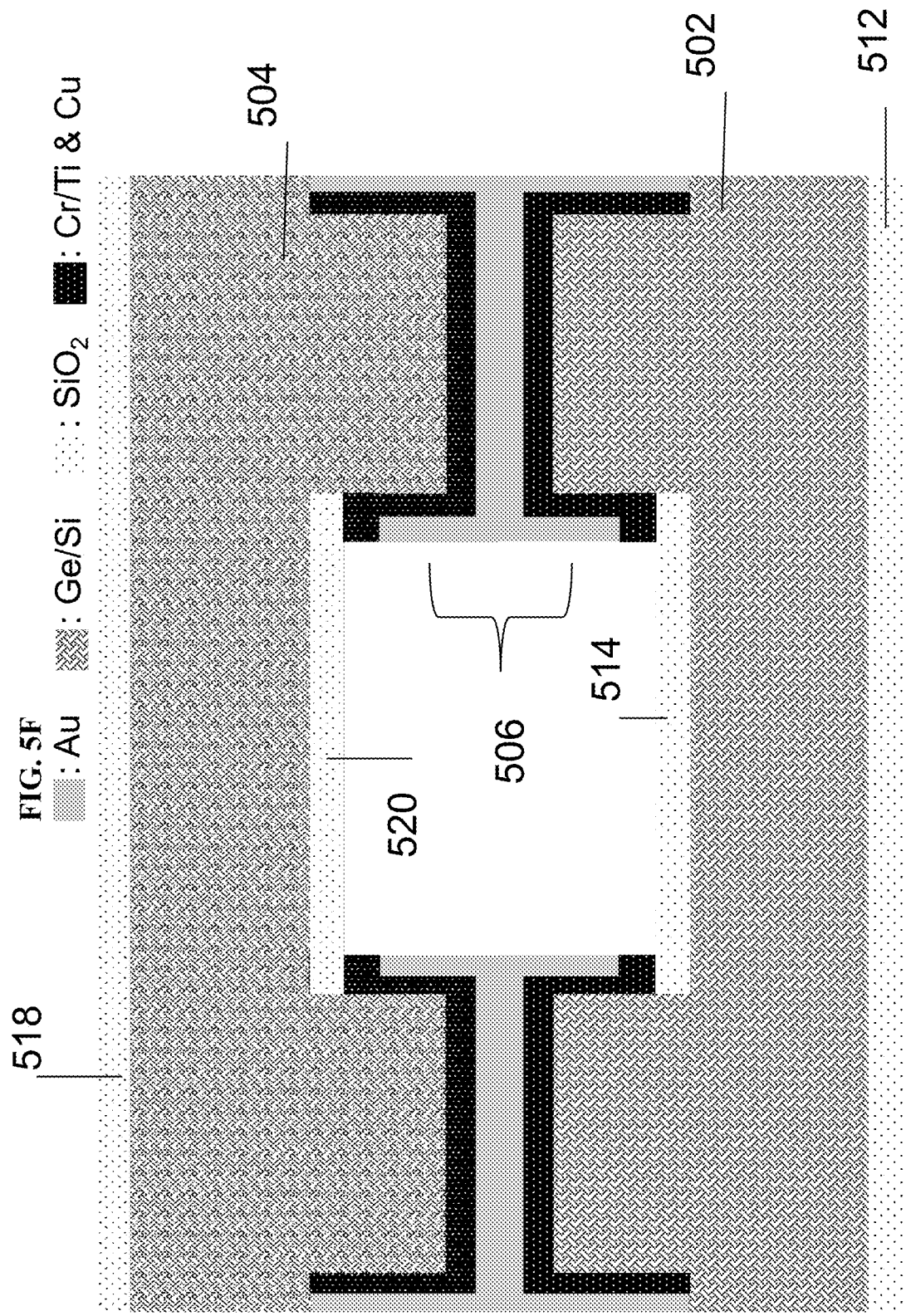
FIG. 5F is a cross-sectional schematic illustrating the bonding of substrates to form a gas or chemical cell according to various embodiments.

FIG. 5F is a cross-sectional schematic illustrating the bonding of substrates 502, 504 to form a gas or chemical cell according to various embodiments. Another substrate 504 may be formed in a similar manner as substrate 402, 502 shown in FIGS. 4A-C, FIGS. 5A-E. A silicon oxide ($SiO_2$) layer 518 may be formed on a backside of the substrate 504, while another silicon oxide ($SiO_2$) layer 520 may be formed on a frontside of the substrate 504. Metal layers of chromium/titanium (Cr/Ti), copper (Cu) and gold (Au) may also be formed on the front side of the substrate 504. The metal layers 506a-b formed on the front side of the substate 502 and the metal layers formed on the front side of the substrate 504 may be bonded together. The holes on substrates 502, 504 may together form a cavity. As shown in FIG. 5F, the metal layers 506a formed on the front side of the substate 502 and the metal layers formed on the front side of the substrate 504 may collectively be referred to as metal layers 506. The metal layers 506 may extend from between the substrates 502, 504 to the sidewalls of the cavity. In addition, the silicon oxide layer 514 may be on a first inner surface of the cavity, while the silicon oxide layer 520 may be on a second inner surface of the cavity opposite the first inner surface. The metal layers 506 on sidewalls of the cavity may join silicon oxide layer 514 to silicon oxide layer 520.

Figure 6:
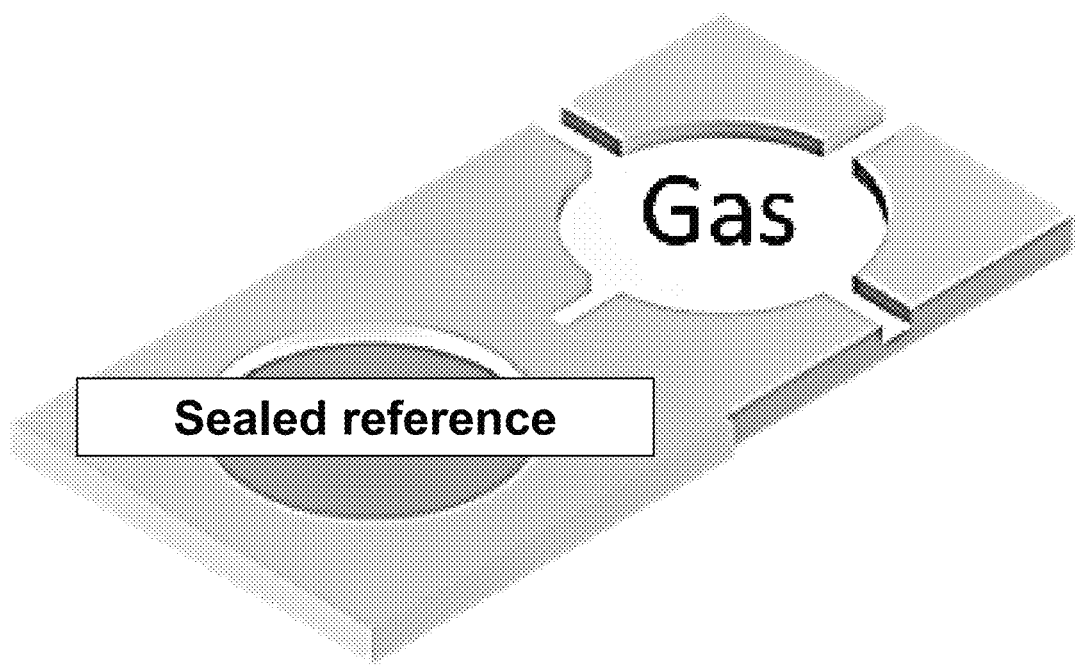
FIG. 6 is schematic showing a perspective view of a chemical sensor including a measurement gas cell, and a reference gas cell according to various embodiments.

In various embodiments, the chemical sensor may include a measurement gas or chemical cell, and a reference gas or chemical cell. The reference gas or chemical cell may be formed or created at the same time as the measurement gas or chemical cell. FIG. 6 is schematic showing a perspective view of a chemical sensor including a measurement gas cell, and a reference gas cell according to various embodiments. The wafer-level multi-gas cell may be made of two wafers patterned with specific depth and geometry to allow for gas to flow into the measurement cell and also for light to be guided in this short region. During bonding, the ambient gas may be nitrogen gas ($N_2$). As a result, the reference gas cell may have $N_2$ sealed in the reference gas cell. In various other embodiments, any other gases or even vacuum may also be sealed in the reference gas cell. Various embodiments may significantly reduce costs as multiple measurement gas cells along with corresponding reference gas cells may be manufactured at the same time. The sealed ambient gas may be used as reference to reduce or minimize influences and establish baseline. By forming or creating measurement gas cells and reference gas cell at the same time on neighboring locations on the same wafer, the effects for aging and production variation may also be reduced or minimized. Thus, the use of the reference gas cell with the measurement gas cell may be more effective than other known methods.

Figure 7:
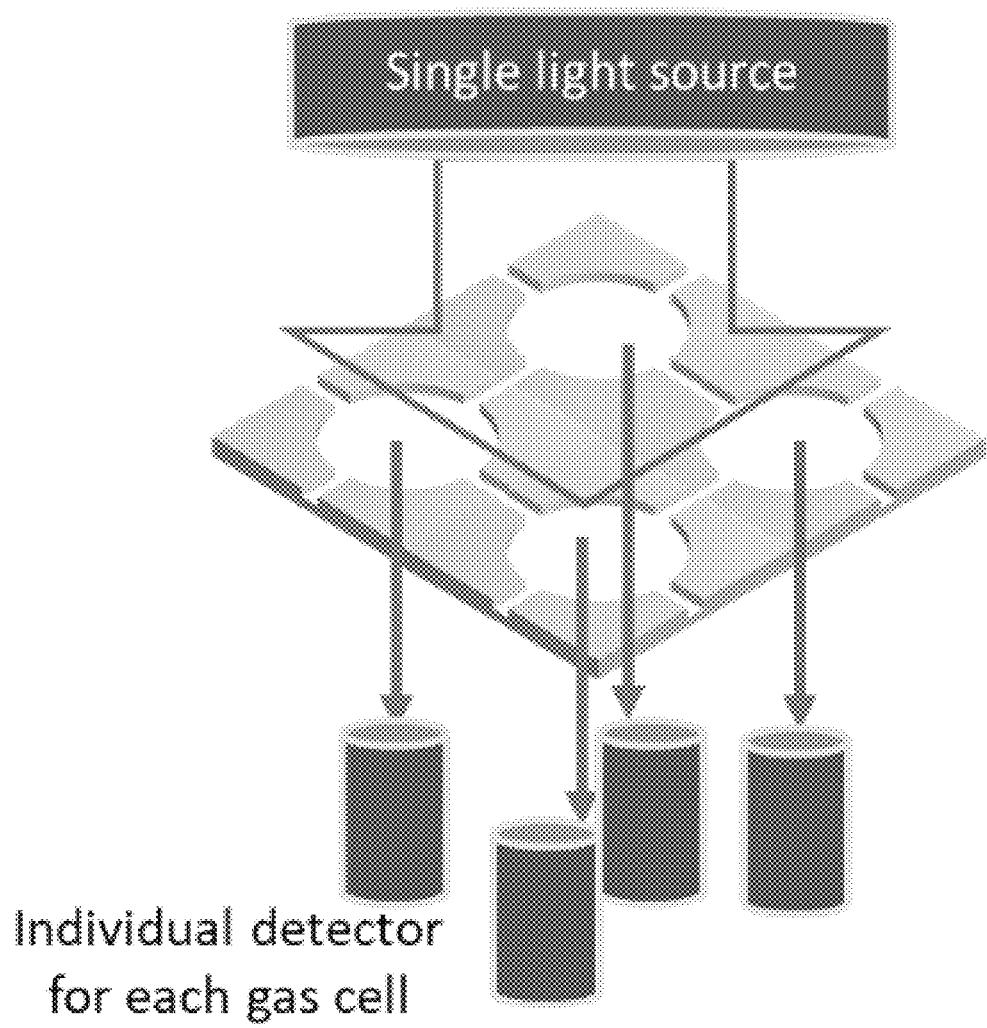
FIG. 7 is schematic showing a perspective view of a chemical sensor including a plurality of gas cells according to various embodiments.

FIG. 7 is schematic showing a perspective view of a chemical sensor including a plurality of gas cells according to various embodiments. Various embodiments may enable improved signal noise averaging. Voltage responsivity may improve when the detector active area is decreased although the total optical signal detected is decreased. However, by adding an array of detectors and gas cells, various embodiments may have the same responsivity, while improving the signal-noise ratio (SNR) by applying signal noise averaging. This technique may only be feasible with the design of gas cells and wafer fabrication as described herein, enabling similar gas cells to be manufactured together with minimal variability as seen in FIG. 7.

Experimental Results

Figure 8:
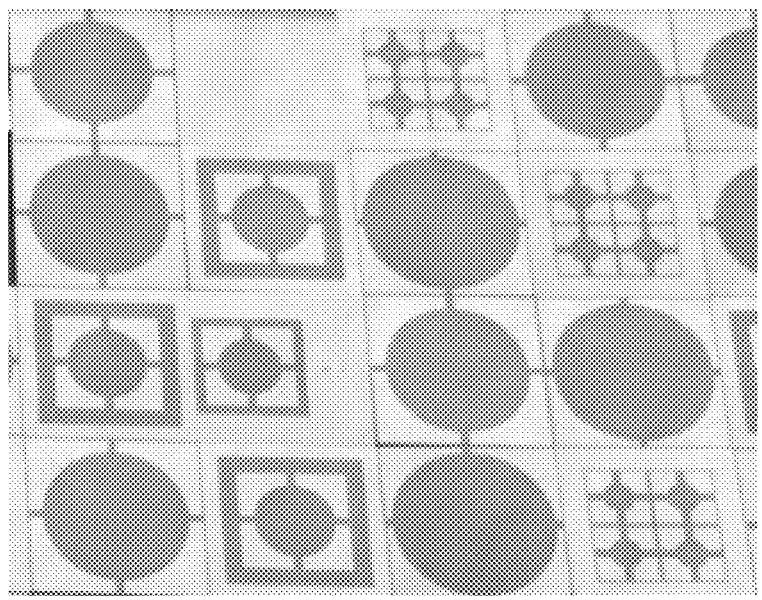
FIG. 8 is an image of a wafer including different fabricated and diced gas cell patterns of different designs according to various embodiments.

FIG. 8 is an image of a wafer including different fabricated and diced gas cell patterns of different designs according to various embodiments. The gas cell patterns may be fabricated based on methods as described herein. The wafer may then be bonded with another corresponding wafer to form different gas cells. The gas cells may be tested with an optical source and an optical detector similar to that shown in FIG. 3C. The signal output (peak-to-peak voltage) in volts (V) from the detector was recorded onto the computer.

Figure 9:
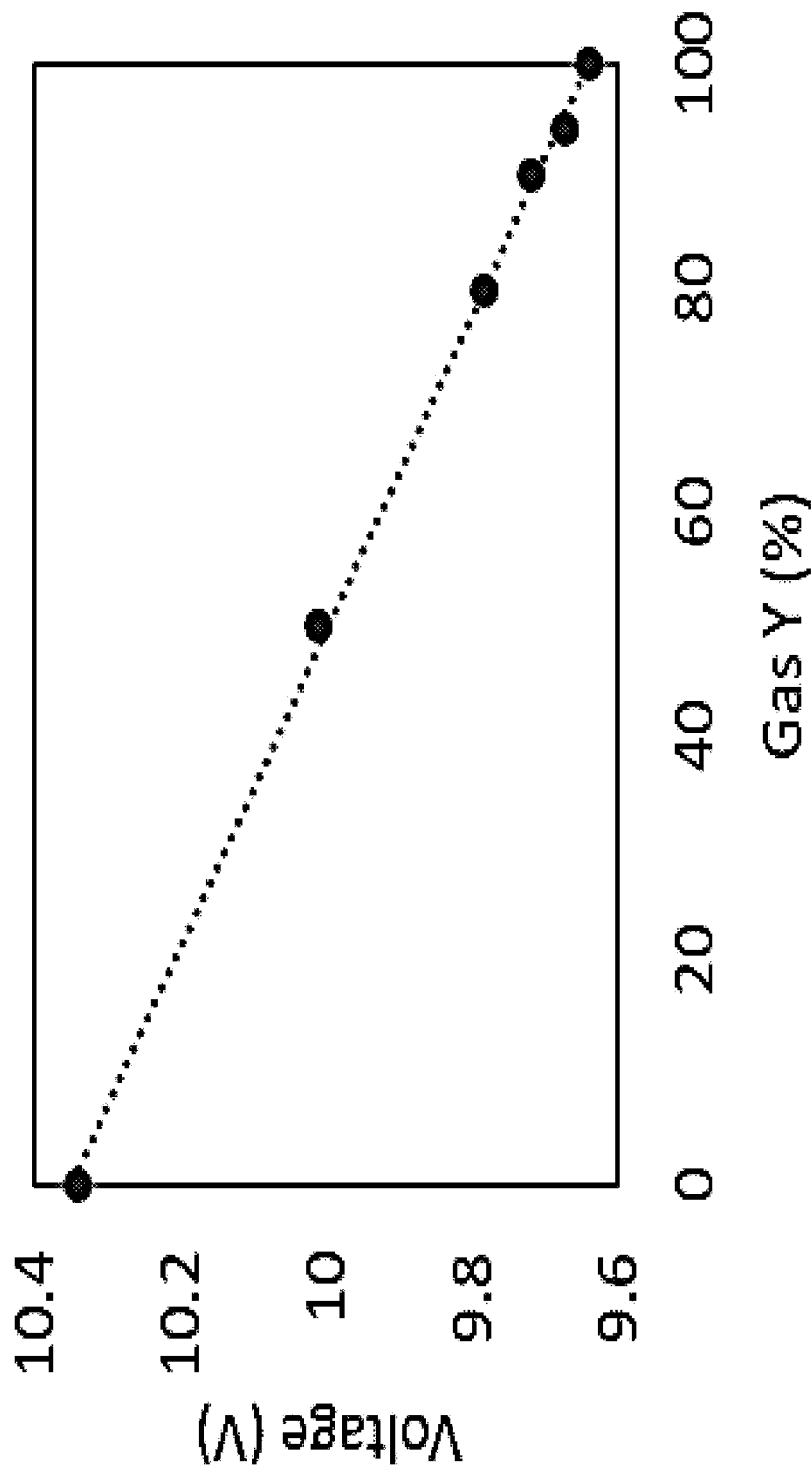
FIG. 9 is a plot of voltage (in volts or V) as a function of percentage of Gas Y (in percent or %) showing the gas sensor testing results for Gas Y according to various embodiments.

FIG. 9 is a plot of voltage (in volts or V) as a function of percentage of Gas Y (in percent or %) showing the gas sensor testing results for Gas Y according to various embodiments. Gas Y is sulfur hexachloride ($SF_6$), and for Gas Y less than 100%, the remaining component (other than $SF_6$) is nitrogen gas ($N_2$). Different concentrations from 0% to 100% of $SF_6$ with $N_2$ balance were tested. Results show that the chemical sensor according to various embodiments may be able to detect different gas concentration and distinguish them even at higher $SF_6$ concentration levels close to 100%.

Figure 10:
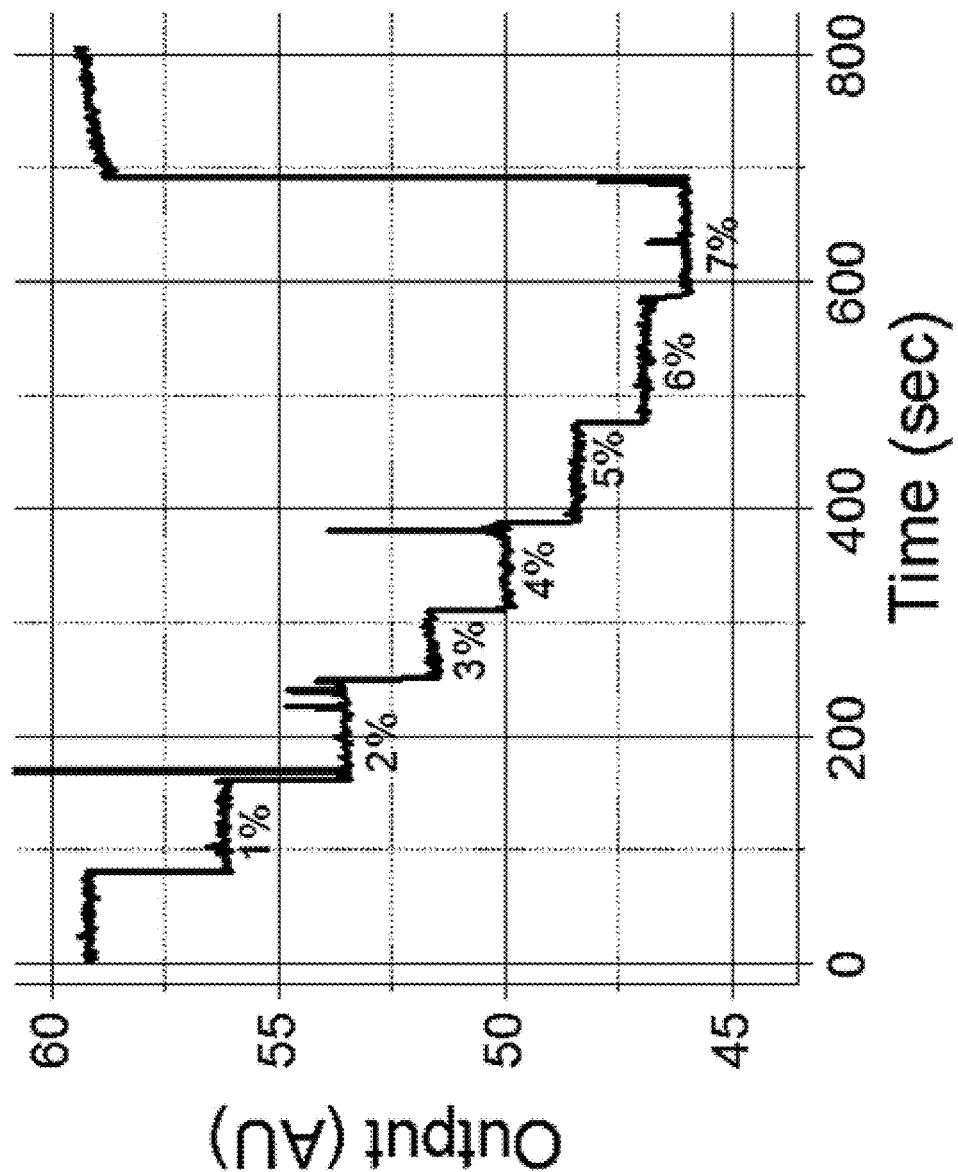
FIG. 10 is a plot of output (in arbitrary units or AU) as a function of time (in seconds or sec) showing the liquid testing results using the chemical sensor according to various embodiments with different concentrations of formic acid in methanol solvent.

The chemical sensor may also be tested using liquids. Different concentrations of formic acid from 0% to 7% in methanol solvent were tested. Results show that the chemical sensor may be able to detect different chemical concentrations as seen in FIG. 10. FIG. 10 is a plot of output (in arbitrary units or AU) as a function of time (in seconds or sec) showing the liquid testing results using the chemical sensor according to various embodiments with different concentrations of formic acid in methanol solvent.

Figure 11:
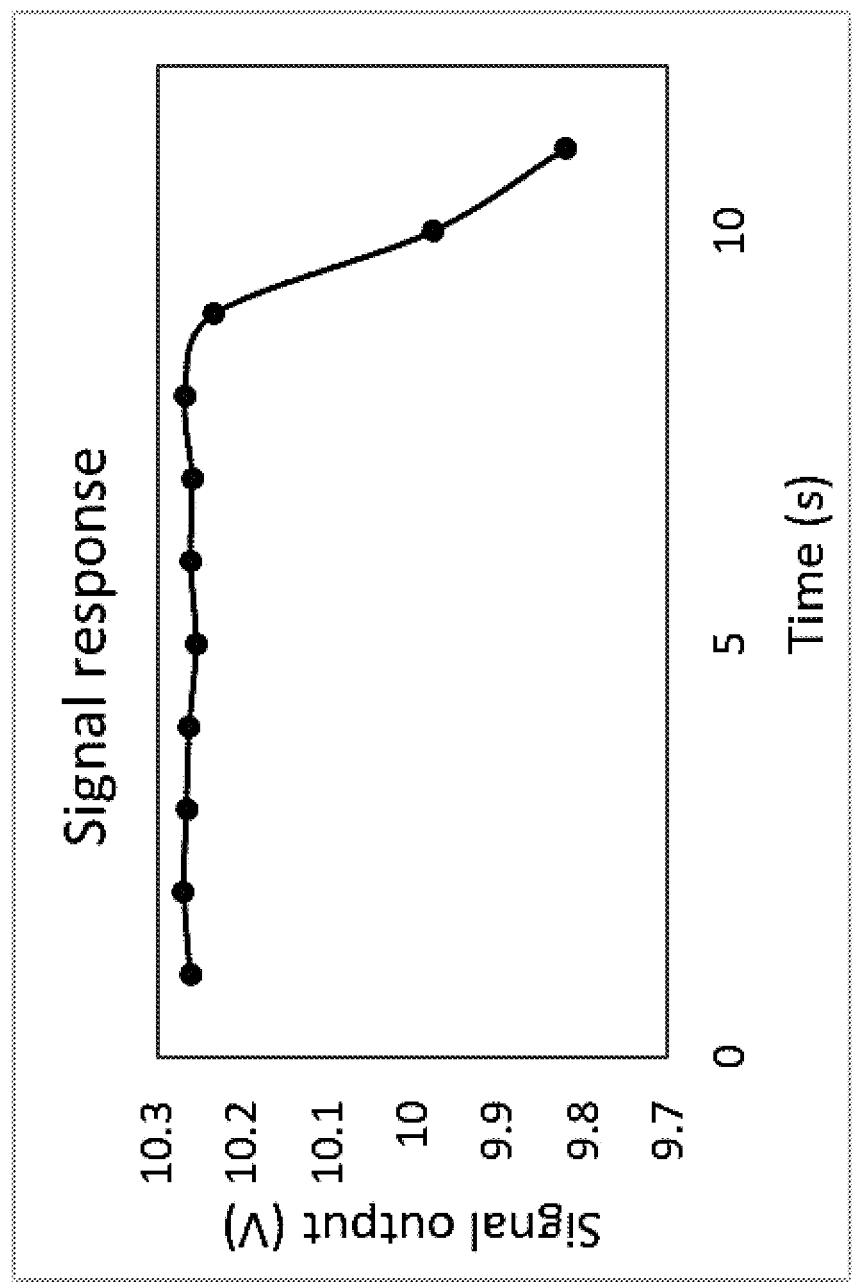
FIG. 11 is a plot of signal output (in volts or V) as a function of time (in second or s) illustrating the response time of the chemical sensor when the concentration is changed according to various embodiments.

Furthermore, due to the small volume of the gas cell at about 5 $mm^3$, a quick response time may be achieved. FIG. 11 is a plot of signal output (in volts or V) as a function of time (in second or s) illustrating the response time of the chemical sensor when the concentration is changed according to various embodiments. Before t=0, $N_2$ was flowing into the sensor, giving an expected output response of 10.26V. At t=0 s, the flow of the previous gas was stopped, and a specific concentration of $SF_6$ was flowed, which should give an expected signal output of 9.8V. FIG. 11 indicates a response time of about 11s.

A wafer-level, high concentration gas sensor that enables high gas concentrations to be detected with high resolution and sensitivity has been demonstrated. Various embodiments may overcome the difficulties using traditional machining method that are unable to achieve short pathlengths (10 nm to 1 mm). Furthermore, various embodiments may enable large quantities to be manufactured at the same time with high uniformity. Various embodiments may allow high concentrations to be accurately and reliably measured economically. Various embodiments may also allow the reference gas cells and actual (measurement) gas cells to be made at the same time to reduce variations in production and ensure higher repeatability. Multiple similar gas cells may also be made that are still small in size and with little variations, enabling reduction in detector noise through signal averaging. Various embodiments may have the benefit of withstanding high pressures and reducing the number of joints exposed to high pressures. On the other hand, other methods may require using different materials and multiple joints. Direct growth of filters, anti-reflective coating and chemical coating may be added to enhance the performance of the gas sensor. Various embodiments may be applicable for wafer-scale or chip-scale integrations for optical gas or chemical sensors.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A chemical sensor comprising:
a first semiconductor substrate comprising a hole;
a second semiconductor substrate comprising a hole;
a plurality of metal layers between the first semiconductor substrate and the second semiconductor substrate such that the first semiconductor substrate, the second semiconductor substrate and the plurality of metal layers form a cell including a cavity, the cavity having a depth of any value equal to or less than 100 µm;
an optical source;
an optical detector such that light emitted by the optical source passes through the cell to the optical detector;
a first non-metal layer on a first inner surface of the cavity; and
a second non-metal layer on a second inner surface of the cavity opposite the first inner surface;
wherein the first semiconductor substrate, the second semiconductor substrate and the plurality of metal layers also define at least one inlet for fluid to flow into the cavity and at least one outlet for fluid to flow out of the cavity;
wherein the plurality of metal layers comprises:
a first adhesion layer in contact with at least a portion of the first semiconductor substrate;
a first bonding layer comprising gold, the first bonding layer in contact with the first adhesion layer;
a second bonding layer comprising gold, the second bonding layer in contact with the first bonding layer; and
a second adhesion layer in contact with at least a portion of the second semiconductor substrate and the second bonding layer;
wherein the first adhesion layer and the first bonding layer extend from between the first semiconductor substrate and the second semiconductor substrate to sidewalls of a first portion of the cavity, the first portion of the cavity defined by the hole of the first semiconductor substrate;
wherein the second adhesion layer and the second bonding layer extend from between the first semiconductor substrate and the second semiconductor substrate to sidewalls of a second portion of the cavity, the second portion of the cavity defined by the hole of the second semiconductor substrate; and
wherein the plurality of metal layers joins the first non-metal layer to the second non-metal layer.

2. The chemical sensor according to claim 1, wherein the depth of the cavity is of any value less than 100 µm.

3. The chemical sensor according to claim 1, wherein the first semiconductor substrate and the second semiconductor substrate comprise silicon or germanium.

4. The chemical sensor according to claim 1, wherein the first adhesion layer and the second adhesion layer comprise chromium or titanium.

5. The chemical sensor according to claim 1, wherein the first semiconductor substrate, the second semiconductor substrate and the plurality of metal layers form a further cell including a further cavity.

6. The chemical sensor according to claim 5, wherein the further cavity is sealed.

7. The chemical sensor according to claim 5, wherein the first semiconductor substrate, the second semiconductor substrate and the plurality of metal layers also define at least one further inlet for fluid to flow into the further cavity and at least one further outlet for fluid to flow out of the further cavity.

8. The chemical sensor according to claim 5, further comprising:
a further optical detector such that light emitted by the optical source passes through the further cell to the further optical detector.

9. The chemical sensor according to claim 1, wherein the optical source and the optical detector are unpackaged dies bonded to the cell using wafer to wafer bonding methods or chip to wafer bonding methods.

10. A method of forming a chemical sensor, the method further comprising:
forming a plurality of metal layers between a first semiconductor substrate, the first semiconductor substrate comprising a hole, and a second semiconductor substrate, the second semiconductor substrate comprising a hole, such that the first semiconductor substrate, the second semiconductor substrate and the plurality of metal layers form a cell including a cavity, the cavity having a depth of any value equal to or less than 100 µm;
providing an optical source;
providing an optical detector such that light emitted by the optical source passes through the cell to the optical detector;
forming a first non-metal layer on a first inner surface of the cavity; and
forming a second non-metal layer on a second inner surface of the cavity opposite the first inner surface;
wherein the first semiconductor substrate, the second semiconductor substrate and the plurality of metal layers also define at least one inlet for fluid to flow into the cavity and at least one outlet for fluid to flow out of the cavity; and
wherein the plurality of metal layers comprises:
a first adhesion layer in contact with at least a portion of the first semiconductor substrate;
a first bonding layer comprising gold, the first bonding layer in contact with the first adhesion layer;
a second bonding layer comprising gold, the second bonding layer in contact with the first bonding layer; and
a second adhesion layer in contact with at least a portion of the second semiconductor substrate and the second bonding layer;
wherein the first adhesion layer and the first bonding layer extend from between the first semiconductor substrate and the second semiconductor substrate to sidewalls of a first portion of the cavity, the first portion of the cavity defined by the hole of the first semiconductor substrate;
wherein the second adhesion layer and the second bonding layer extend from between the first semiconductor substrate and the second semiconductor substrate to sidewalls of a second portion of the cavity, the second portion of the cavity defined by the hole of the second semiconductor substrate; and
wherein the plurality of metal layers joins the first non-metal layer to the second non-metal layer.

11. The method according to claim 10, wherein the cavity has a depth of the cavity is of any value less than 100 µm.

12. The method according to claim 10, wherein the first semiconductor substrate and the second semiconductor substrate comprise silicon or germanium.

13. The method according to claim 10,
wherein the first semiconductor substrate is patterned before forming the first adhesion layer of the plurality of metal layers in contact with the first semiconductor substrate, and forming the first bonding layer of the plurality of metal layers in contact with the first adhesion layer;
wherein the second semiconductor substrate is patterned before forming the second adhesion layer of the plurality of metal layers in contact with the second semiconductor substrate, and forming the second bonding layer of the plurality of metal layers in contact with the second adhesion layer; and
wherein the method further comprises bonding the first bonding layer and the second bonding layer to form the cell including the cavity.

14. The method according to claim 13, wherein the first adhesion layer and the second adhesion layer comprise chromium or titanium.

15. The method according to claim 10, wherein the first semiconductor substrate, the second semiconductor substrate and the plurality of metal layers form a further cell including a further cavity.

16. The method according to claim 15, wherein the further cavity is sealed.

17. The method according to claim 15, wherein the first semiconductor substrate, the second semiconductor substrate and the plurality of metal layers also define at least one further inlet for fluid to flow into the further cavity and at least one further outlet for fluid to flow out of the further cavity.

* * * * *